(12) United States Patent
Inoue et al.

(10) Patent No.: US 6,784,490 B1
(45) Date of Patent: Aug. 31, 2004

(54) HIGH-VOLTAGE MOS TRANSISTOR

(75) Inventors: Haruko Inoue, Shiga (JP); Yuichi Kitamura, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 34 days.

(21) Appl. No.: 09/666,156

(22) Filed: Sep. 19, 2000

(30) Foreign Application Priority Data

Sep. 24, 1999 (JP) .......................................... 11-270778

(51) Int. Cl.⁷ .......................... H01L 29/76; H01L 29/94; H01L 31/062; H01L 31/113
(52) U.S. Cl. ....................... 257/344; 257/401; 257/408; 257/409
(58) Field of Search ............................... 257/335, 344, 257/409, 401, 408

(56) References Cited

U.S. PATENT DOCUMENTS 6,084,283 A * 7/2000 Arai ........................... 257/344

FOREIGN PATENT DOCUMENTS

| JP | 62141754 | 6/1987 | |
| JP | 1-305573 | * 12/1989 | ................. 257/409 |
| JP | 03-126253 | 5/1991 | |
| JP | 04062975 A | 2/1992 | |

* cited by examiner

*Primary Examiner*—Steven Loke
(74) *Attorney, Agent, or Firm*—Nixon Peabody LLP; Donald R. Studebaker

(57) ABSTRACT

A high-voltage MOS transistor wherein a dopant concentration of a source offset region is set lower than a dopant concentration of a drain offset region whereby a resistance value of the resource region is set independently of a resistance value of the drain region in such a manner as to maintain a high sustaining breakdown voltage of the high-voltage MOS transistor, which is based on a voltage of the source offset region and a voltage of a substrate region directly under a gate insulating film during operation of the high-voltage MOS transistor.

4 Claims, 14 Drawing Sheets

US 6,784,490 B1

HIGH-VOLTAGE MOS TRANSISTOR

BACKGROUND OF THE INVENTION

The present invention relates to an MOS transistor with an increased breakdown voltage (which will be herein called a "high-voltage MOS transistor") and a method for fabricating the transistor.

Various structures have been specially designed for a high-voltage MOS transistor. Among other things, a LOCOS off-set structure is particularly effectively applicable to an MOS transistor, of which the gate, source and drain all have to have an increased breakdown voltage (e.g., as in a liquid crystal display driver). In the LOCOS offset structure, a relatively thick field oxide film (typically, a locally oxidized silicon (LOCOS) film) is formed around the edges of the gate electrode of an MOS transistor or between the gate electrode and source/drain regions thereof.

The LOCOS offset structure includes offset regions and well offset regions. The offset regions together form a lightly-doped layer under the LOCOS regions that are located around the edges of a gate electrode. These offset regions are provided mainly to prevent the intensity of an electric field from increasing too much at the pn junction between the drain region and a region under the gate electrode. The off-set regions are of the same conductivity type as the source/drain regions but doped more lightly than the source/drain regions. The well offset regions also form a lightly-doped layer under the source/drain regions, but are located deeper than the offset regions. These well offset regions are provided mainly to prevent the intensity of an electric field from increasing too much in the pn junction between the drain region and a well or a substrate region of the opposite conductivity type under the drain region. The well offset regions are also of the same conductivity type as the source/drain regions and the offset regions but are doped even more lightly than the offset regions. That is to say, the source/drain, offset and well offset regions are all of a conductivity type, but their dopant concentrations decrease in this order. Specifically, the source/drain regions have the highest dopant concentration, the offset regions have the next highest and the well offset regions the lowest.

Hereinafter, a known high-voltage MOS transistor with the LOCOS offset structure will be described with reference to FIGS. 11 and 12. FIGS. 11 and 12 are respectively a cross-sectional view and a plan view illustrating the known high-voltage MOS transistor. As shown in FIGS. 11 and 12, the high-voltage transistor is normally formed along with a transistor with a low breakdown voltage (which will be herein called a "low-voltage transistor") on the same chip. In the example illustrated in FIGS. 11 and 12, the high- and low-voltage transistors a and b are implemented as an n-channel MOS transistor (NMOS) and a p-channel MOS transistor (PMOS), respectively.

First, the structure of the high-voltage transistor a will be described. A p-well 2 is defined for the high-voltage NMOS a inside a p-type substrate 1 and a gate electrode 8 is formed over the p-well 2 with a gate oxide film 7 interposed therebetween. LOCOS regions 6 are formed around the edges of the gate electrode 8 and between the gate electrode 8 and source/drain regions 9s and 9d to electrically isolate the gate electrode 8 from the source/drain regions 9s and 9d on the surface of the substrate 1. Source/drain offset regions 4s and 4d are provided under the LOCOS regions 6 around the edges of the gate electrode 8. And source/drain well offset regions 3s and 3d are further provided under the source/drain regions 9s and 9d. The source offset and well offset regions 4s and 3s are not always needed because, normally, the intensity of an electric field should not increase so much on the source side according to ordinary specifications. However, a transistor device is usually formed symmetrically to have source/drain regions of the same length and with the same dopant concentration. This is because the source/drain regions should not be fixed but are preferably used interchangeably. That is to say, the lengths Ls and Ld of the source/drain offset regions 4s and 4d are preferably equal to each other. In addition, the length 0d of a region overlapping between the drain offset and well offset regions 4d and 3d is also equal to the length 0s of a region overlapping between the source offset and well offset regions 4s and 3s. In this structure, the gate, source and drain regions of the NMOS a are electrically isolated from a channel stopper 10, which is a doped layer for creating a potential in the p-well 2, by n- and p-type isolating regions 4 and 5 and LOCOS regions 6.

Next, the structure of the low-voltage transistor b will be described. An n-well 3 is defined for the low-voltage PMOS b inside the p-well 2. Another gate electrode 8 is formed over the n-well 3 with the gate oxide film 7 interposed therebetween, and source/drain regions 11s and 11d are defined on the left- and right-hand sides of the gate electrode 8. In this structure, the gate, source and drain regions of the PMOS b are electrically isolated from a channel stopper 12, which is a doped layer for creating a potential in the n-well 3, by the n- and p-type isolating regions 4 and 5 and the LOCOS regions 6.

Hereinafter, a method for fabricating the known high-voltage MOS transistor with the LOCOS offset structure will be described with reference to FIGS. 13(a) through 13(d).

First, as shown in FIG. 13(a), the p-well 2 is defined in the surface region of the p-type substrate 1 by photolithography, ion implantation and annealing processes. Next, as shown in FIG. 13(b), the n-well 3 and the source/drain well offset regions 3s and 3d are defined in respective surface regions of the p-well 2 by photolithography, ion implantation and annealing processes. Subsequently, as shown in FIG. 13(c), the n- and p-type isolating regions 4 and 5 and the source/drain offset regions 4s and 4d are formed in the upper parts of the p-well 2 by photolithography and ion implantation processes. Then, the LOCOS regions 6 are formed to cover these regions. Thereafter, as shown in FIG. 13(d), the gate oxide film 7 and the gate electrodes 8 are formed on the surface of the substrate 1. Finally, the source/drain regions 9s and 9d and 11s and 11d and the channel stoppers 10 and 12 are formed by photolithography, ion implantation and annealing processes. In this manner, the high- and low-voltage MOS transistors a and b are formed on the same chip.

Next, it will be described how the known high-voltage MOS transistor with the LOCOS offset structure operates. When a high voltage is applied to the gate electrode 8 and the drain region 9d, the high-voltage NMOS a turns ON. Then, not only the drain region 9d but also the drain offset and well offset regions 4d and 3d, which are lightly-doped layers of the same conductivity type as the drain region 9d, are depleted. Thus, it is possible to prevent the intensity of an electric field from increasing too much locally around the drain region 9d. As a result, the breakdown voltage of the NMOS a can be increased sufficiently.

In the known structure, however, a substrate potential VW easily exceeds a source potential VS. More exactly, the substrate potential VW minus the forward biased breakdown voltage of silicon often exceeds the source potential VS. Accordingly, a breakdown voltage, causing avalanche breakdown of a transistor called "sustaining breakdowns" (which will be herein called a "sustaining breakdown voltage"), is adversely low.

Hereinafter, it will be described with reference to FIGS. 14(a) and 14(b) how and when the sustaining breakdown occurs in the known high-voltage MOS transistor with the LOCOS offset structure. In the following description, the sustaining breakdown of the NMOS a will be explained for illustrative purposes. FIGS. 14(a) and 14(b) illustrate how the known high-voltage MOS transistor operates. Specifically, FIG. 14(a) is a cross-sectional view of the transistor in operation, while FIG. 14(b) is a graph showing a relationship between the drain voltage and the current.

As shown in FIG. 14(a), although voltages are applied to the high-voltage MOS transistor at the electrode terminals G, D2, S2 and W2, it is regions G, D1, S1 and W1 under the gate electrode 8 that actually operate as the gate, drain, source and well of the transistor. Accordingly, the mechanism of the sustaining breakdown will be described with our attention mainly focused on these regions. The electrode terminals D2, S2 and W2 are separated from the regions D1, S1 and W1, actually serving as the drain, source and well of the transistor, with resistance components RD, RS and RW for the drain and source offset regions 4d and 4s and the p-well 2 interposed therebetween. These resistance components RD, RS and RW are provided to prevent the intensity of an electric field from increasing too much.

When a positive voltage is applied to the gate electrode 8 and the drain region 9d, the high-voltage MOS transistor turns ON. As a result, not only the drain region 9d but also the drain offset and well offset regions 4d and 3d, which are lightly-doped layers of the same conductivity type, are depleted. When these regions 3d, 4d and 9d are sufficiently depleted by further increasing the voltage applied, electrons, which are the majority carriers in the n-type regions, start to move from the source toward the drain and a drain current ID1 starts to flow. Part of the drain current ID1 flows toward the source region 9s, which current will be herein called a "source current IS1". And the other part of the drain current ID1 flows vertically toward the well 2 and the substrate 1 which current will be herein called a "substrate current IW1". That is to say, ID1=IS1+IW1. It should be noted that the substrate current is usually labeled as Isub, but is herein identified by IW1. The relationship between the drain voltage VD1 and the current ID1 is shown in FIG. 14(b). As can be seen from FIG. 14(b), while the drain voltage VD1 is relatively low, the drain current ID1 is approximately equal to the source current IS1 and almost no substrate current IW1 flows.

However, as the drain voltage VD1 increases, electrons, moving around the drain, are accelerated by the electric field with an intensity increased by the drain voltage VD1 and collide against the lattice sites of silicon to create electron-hole pairs. The holes created in this manner are swept by the electric field toward the well and the substrate. As a result, the substrate current IW1 starts to flow. This substrate current IW1 and the resistance component RW of the p-well 2 change the substrate voltage VW1. That is to say, since the substrate current IW1 is flowing, the substrate potential VW1 (=RW·IW1) is created in the well and is much higher than the source potential VS1, because the source potential VS2 is fixed at 0 V. As a result of this variation in substrate voltage VW1, the substrate voltage VW1 minus the forward biased breakdown voltage of silicon comes to exceed the source voltage VS1 and the pn junction between the substrate and the source is forward biased. That is to say, in this case, the regions S1, W1 and D1 serve as emitter, base and collector for a parasitic bipolar transistor, not as the source, well and drain for the MOS transistor. And since the parasitic bipolar transistor turns ON, the amount of current flowing starts to rise abruptly. Thereafter, as the drain voltage VD1 increases, the substrate current IW1 goes on increasing steeply. And when the drain voltage VD1 reaches x volts, the drain current ID1 reaches a current value causing breakdown of the transistor. As a result, sustaining breakdown occurs. This value x of the drain voltage VD1 is the sustaining breakdown voltage of the known high-voltage MOS transistor.

SUMMARY OF THE INVENTION

It is therefore an object of the present invention to provide a high-voltage MOS transistor that can have its sustaining breakdown voltage increased while maintaining good characteristics and a method for fabricating the transistor.

To achieve this object, according to the inventive high-voltage MOS transistor and its fabrication process, the source resistance value RS1 is appropriately controlled, thereby preventing the substrate voltage VW1 minus the forward biased breakdown voltage of silicon from exceeding the source voltage VS1. As a result, an MOS transistor with an increased sustaining breakdown voltage and its fabrication process can be obtained.

To avoid the sustaining breakdown, the substrate voltage VW1 minus the forward biased breakdown voltage of silicon should be kept equal to or less than the source voltage VS1 by intentionally changing at least one of the parameters included in the equations of VW1=RW·IW1 and VS1=RS·IS1. However, the source current IS1 and the substrate current IW1 are determined substantially univalently by the drain voltage VD1 and are not changeable arbitrarily. Also, the resistance RW of the p-well 2 is determined according to the constraints that should be met to realize the characteristics expected of the MOS transistor and is not changeable either for just the purpose of increasing the sustaining breakdown voltage. The same statement is not applicable to the source resistance RS though. As described above, the source resistance RS is normally set equal to the drain resistance RD because the source/drain regions are usually designed to have the same length and the same dopant concentration. This symmetrical arrangement is adopted just to simply the design process. Accordingly, generally speaking, the source/drain regions do not always have to have the same length and the same concentration to realize good characteristics for the transistor. The drain offset region, implementing the drain resistance RD, is provided to prevent the intensity of an electric field from increasing too much when depleted upon the application of the drain voltage VD1. The value of the drain resistance RD is limited by the drain voltage, the operating speed of the transistor and the ON resistance characteristics. In contrast, the value of the source resistance RS is not limited so much and changeable relatively easily, because the source resistance RS is defined with the source potential VS2 fixed at zero volts, not with a high electric field applied unlike the case of the drain resistance RD.

For these reasons, it can be seen that only the source resistance value RS is regulable arbitrarily. By appropriately setting the source resistance value RS independently of the drain resistance value RD, the source voltage VS1 can be increased, and therefore, the substrate voltage VW1 minus the forward biased breakdown voltage of silicon can be kept equal to or less than the source voltage VS1. As a result, it is possible to avoid the sustaining breakdown.

In the known high-voltage MOS transistor, the drain resistance value RD is set to an appropriate value to realize ideal transistor characteristics. However, since the source/drain regions have been formed symmetrically just to simply the fabrication process or the circuit specifications, the source resistance value RS has not been set to its best value. Thus, according to the present invention, the source resistance value RS is adaptively changed into a most desirable value, thereby providing a high-voltage MOS transistor and its fabrication process that can easily increase the sustaining breakdown voltage while ensuring good characteristics for the MOS transistor.

In the MOS transistor of the present invention, the source/drain regions might have an asymmetrical structure or asymmetrical dopant concentration profile, but there will be no problems even in that situation. In general, in a low-voltage MOS transistor to be driven at 5 V, for example, the source/drain regions are formed symmetrically in the gate longitudinal direction. This is simply because such a symmetrical structure, in which the source/drain regions are usable interchangeably, is advantageous to increase the flexibility of circuit specifications. In contrast, as for a high-voltage transistor, the design process of the circuit will not be affected even if the source/drain regions are defined non-interchangeably. Accordingly, the source/drain regions may have mutually different resistance values or an asymmetrical structure in the gate longitudinal direction.

To increase the sustaining breakdown voltage, an external resistor has often been formed for the source region in the prior art. However, according to the present invention, there is no need to provide such an external resistor. And yet the same effects as those of the known transistor with the external resistor are still attainable by taking advantage of the resistance of an offset region for an MOS transistor with the LOCOS offset structure in its source/drain regions.

Specifically, an inventive high-voltage MOS transistor is characterized in that a resistance value of a source region is set independently of a resistance value of a drain region in such a manner as to increase a sustaining breakdown voltage of the transistor.

In one embodiment of the present invention, a resistance value of a source offset region is set independently of a resistance value of a drain offset region in such a manner as to increase the sustaining breakdown voltage of the transistor.

Another inventive high-voltage MOS transistor includes a drain offset region and a source offset region, which is asymmetrical to the drain offset region, such that the transistor has a high sustaining breakdown voltage.

In one embodiment of the present invention, a size of the source offset region is not equal to a size of the drain offset region such that the transistor has the high sustaining breakdown voltage.

In another embodiment of the present invention, a dopant concentration of the source offset region is not equal to a dopant concentration of the drain offset region such that the transistor has the high sustaining breakdown voltage.

Still another inventive high-voltage MOS transistor includes a drain offset region and a source offset region, which has a dopant concentration different from that of the drain offset region, such that the transistor has a high sustaining breakdown voltage.

In one embodiment of the present invention, the resistance value of the source region is set higher than that of the drain region such that a substrate voltage VW minus a forward biased breakdown voltage of silicon does not exceed a source voltage VS easily.

An inventive method for fabricating a high-voltage MOS transistor includes the steps of: defining a resist pattern that makes a size of a source offset region greater than a size of a drain offset region; and forming the source and drain offset regions using the resist pattern to increase a sustaining breakdown voltage of the transistor.

Another inventive method for fabricating a high-voltage MOS transistor includes the steps of: forming a drain offset region; and forming a source offset region by implanting dopant ions at such a level as setting a dopant concentration of the source offset region independently of a dopant concentration of the drain offset region to increase a sustaining breakdown voltage of the transistor.

In one embodiment of the present invention, the dopant concentration of the source offset region is set lower than that of the drain offset region.

Still another inventive method for fabricating a high-voltage MOS transistor, which will be formed along with a low-voltage MOS transistor on the same chip, includes the steps of: shifting a photomask for forming a well for the low-voltage MOS transistor and source and drain well offset regions for the high-voltage MOS transistor to such a position as making a size of a region overlapping between the source well offset region and a source offset region smaller than that of a region overlapping between the drain well offset region and a drain offset region; and forming the source and drain well offset regions for the high-voltage MOS transistor using the photomask to increase a sustaining breakdown voltage of the high-voltage MOS transistor.

In the inventive high-voltage MOS transistor and its fabrication process, a resistance value of the source region is set independently of that of the drain region. Accordingly, a voltage value obtained by subtracting the forward biased breakdown voltage of silicon from the substrate voltage VW is much less likely to exceed the source voltage VS. As a result, it is possible to increase the sustaining break-down voltage of the MOS transistor while ensuring good characteristics for the transistor.

BRIEF DESCRIPTION OF THE DRAWINGS

FIG. 3(a) illustrates the process step of forming a p-well;

FIG. 3(b) illustrates the process step of forming source/drain well offset regions;

FIG. 3(c) illustrates the process step of forming and p-type isolating regions, source/drain offset regions and LOCOS regions; and FIG. 3(d) illustrates the process step of forming source/drain regions.

DESCRIPTION OF THE PREFERRED EMBODIMENTS

Hereinafter, preferred embodiments of the present invention will be described with reference to the accompanying drawings.

EMBODIMENT 1

Figure 1:
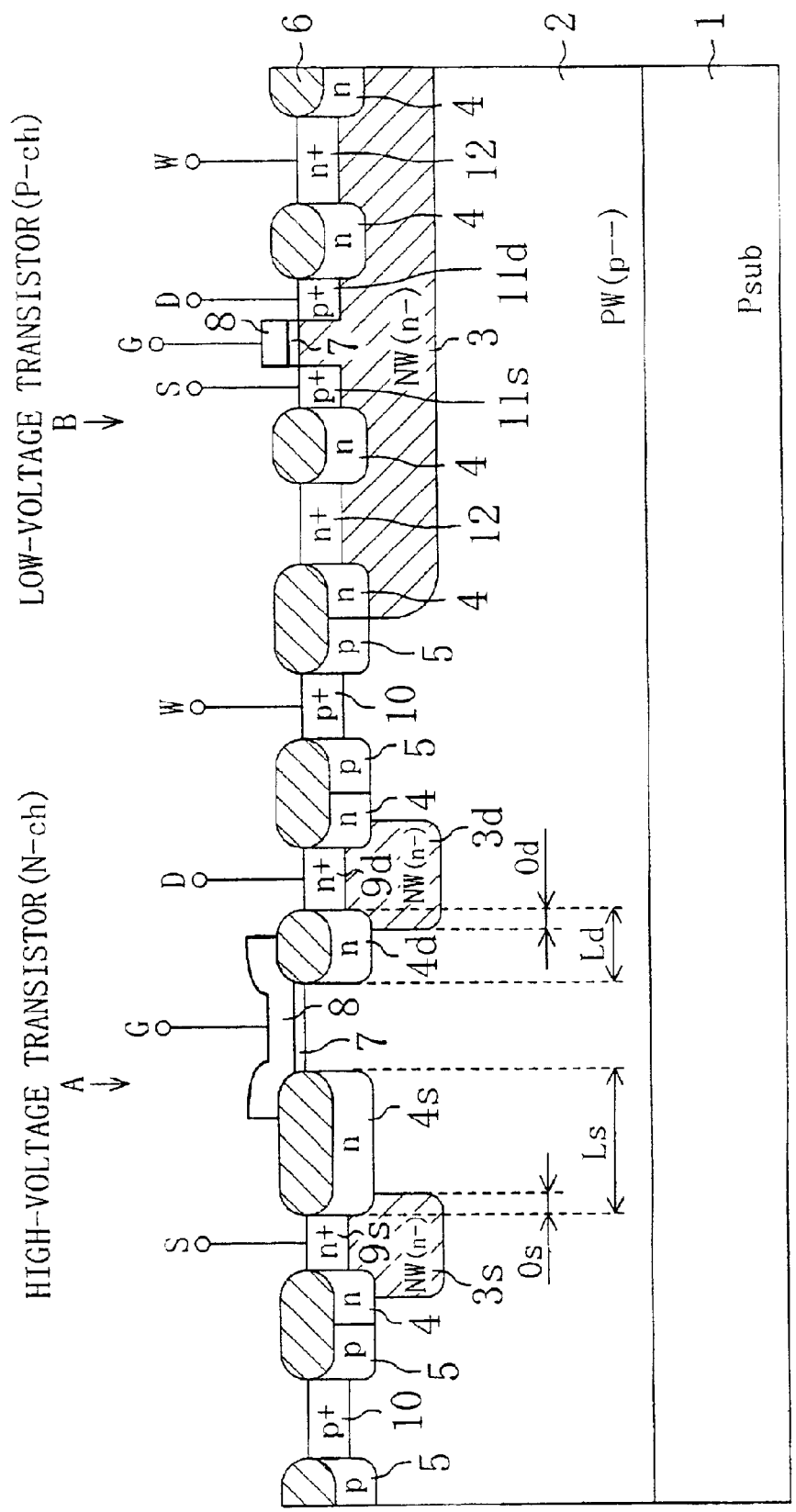
FIG. 1 is a cross-sectional view illustrating a high-voltage MOS transistor according to a first embodiment of the present invention.
Figure 2:
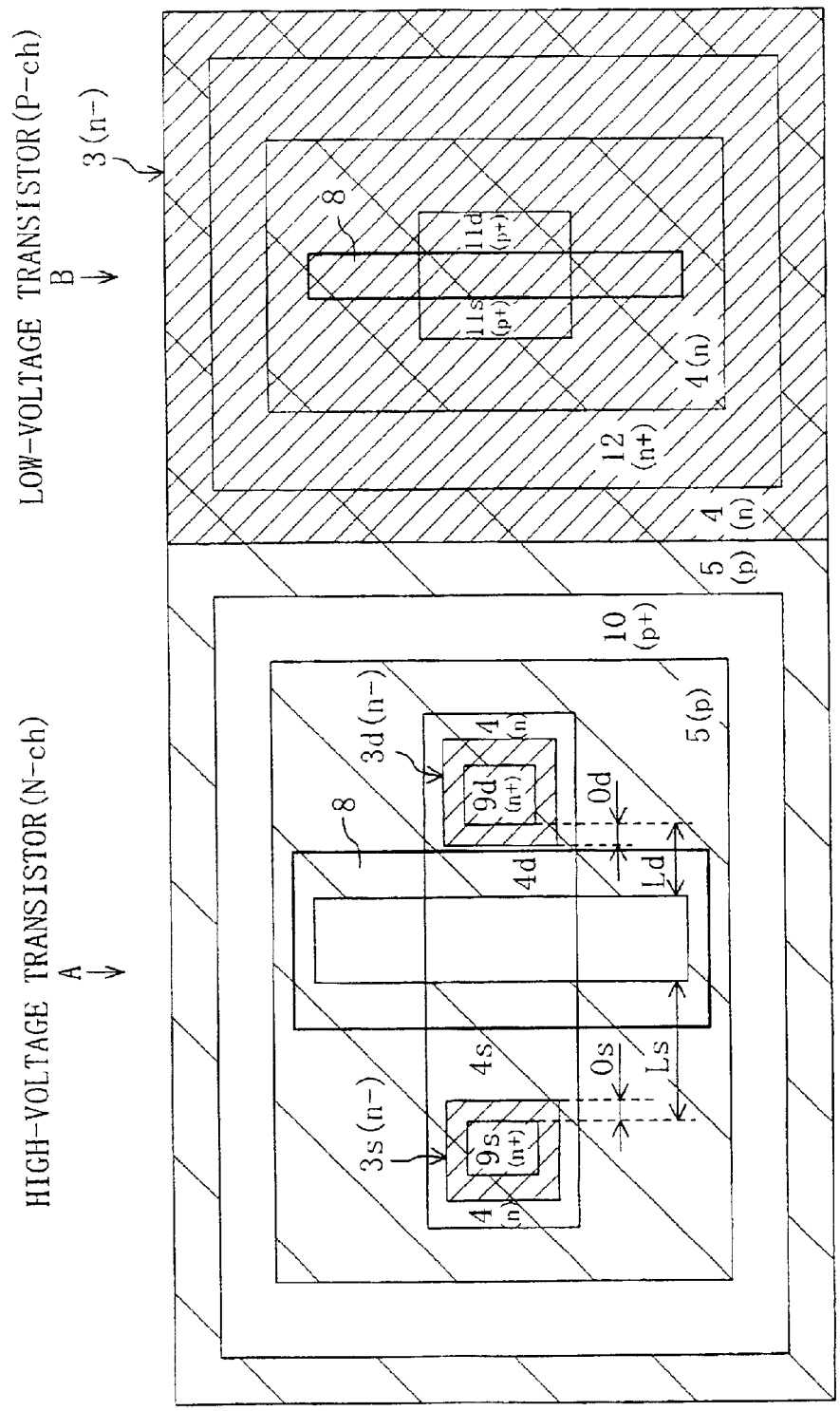
FIG. 2 is a plan view illustrating the high-voltage MOS transistor of the first embodiment.

FIGS. 1 and 2 illustrate a high-voltage MOS transistor with a LOCOS offset structure according to a first embodiment of the present invention. Specifically, FIGS. 1 and 2 are respectively a cross-sectional view and a plan view illustrating the high-voltage MOS transistor of the first embodiment.

As shown in FIGS. 1 and 2, the high-voltage transistor is formed along with a low-voltage transistor on the same chip. In the illustrated embodiment, the high- and low-voltage transistors A and B are implemented as an NMOS and a PMOS, respectively.

First, the structure of the high-voltage transistor A will be described with reference to FIGS. 1 and 2. A p-well 2 is defined for the high-voltage NMOS A inside a p-type substrate 1 and a gate electrode 8 is formed over the p-well 2 with a gate oxide film 7 interposed therebetween. LOCOS regions 6 are formed around the edges of the gate electrode 8 and between the gate electrode 8 and source/drain regions 9s and 9d to electrically isolate the gate electrode 8 from the source/drain regions 9s and 9d on the surface of the substrate 1. Source/drain offset regions 4s and 4d are provided under the LOCOS regions 6 around the edges of the gate electrode 8. And source/drain well offset regions 3s and 3d are further provided under the source/drain regions 9s and 9d.

As shown in FIGS. 1 and 2, although the source/drain offset regions 4s and 4d have the same dopant concentration and the same diffusion depth, the length Ls of the source offset region 4s is greater than the length Ld of the drain offset region 4d.

However, the relative positional relationship between the offset and well offset regions is the same as that of the known structure. That is to say, the length Od of a region overlapping between the drain offset and well offset regions 4d and 3d is also equal to the length 0s of a region overlapping between the source offset and well offset regions 4s and 3s.

In this structure, the gate, source and drain regions of the NMOS A are electrically isolated from a channel stopper 10, which is a doped layer for creating a potential in the p-well 2, by n- and p-type isolating regions 4 and 5 and LOCOS regions 6.

Next, the structure of the low-voltage transistor B will be described with reference to FIGS. 1 and 2. An n-well 3 is defined for the low-voltage PMOS B inside the p-well 2. Another gate electrode 8 is formed over the n-well 3 with the gate oxide film 7 interposed therebetween, and source/drain regions 11s and 11d are defined on the left- and right-hand sides of the gate electrode 8. In this structure, the gate, source and drain regions of the PMOS B are electrically isolated from a channel stopper 12, which is a doped layer for creating a potential in the n-well 3, by the n- and p-type isolating regions 4 and 5 and LOCOS regions 6.

Hereinafter, a method for fabricating the high-voltage MOS transistor with the LOCOS offset structure of the first embodiment will be described with reference to FIGS. 3(a) through 3(d).

Figure 3A:
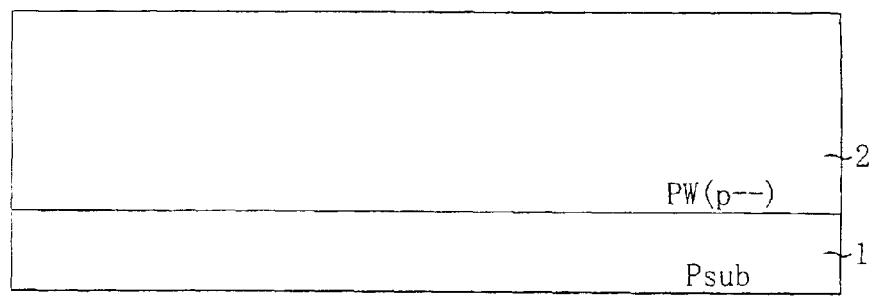
FIGS. 3(a) through 3(d) are cross-sectional views illustrating respective process steps for fabricating the high-voltage MOS transistor of the first embodiment.

First, as shown in FIG. 3(a), the p-well 2 is defined in the surface region of the p-type substrate 1 by photolithography, ion implantation and annealing processes. In the illustrated embodiment, ions of a p-type dopant (e.g., boron) are implanted into the surface region of the p-type substrate 1 with a resistivity of 10 to 50 Ω·cm using a resist pattern that has been defined to form the well 2 for the high-voltage transistor. Then, the substrate is annealed to form the p-well 2 with a dopant concentration of $2.0\times10^{15}$ cm$^{-3}$ and a diffusion depth of about 15 μm, for example.

Figure 3B:
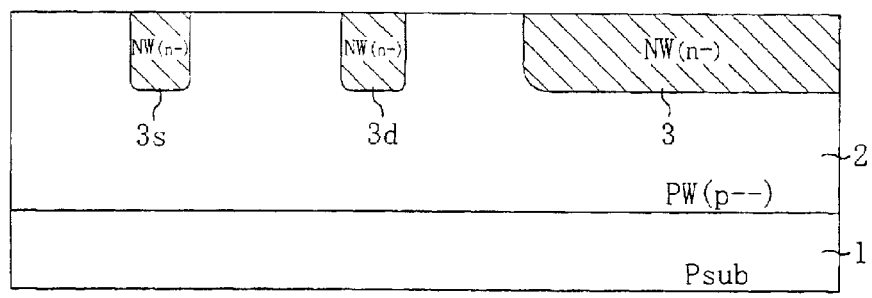

Next, as shown in FIG. 3(b), the n-well 3 and source/drain well offset regions 3s and 3d are defined in respective surface regions of the p-well 2 by photolithography, ion implantation and annealing processes. In the illustrated embodiment, ions of an n-type dopant (e.g., phosphorus) are implanted using a resist pattern that has been defined to form the well 3 for the low-voltage transistor. Then, the substrate is annealed to form the n-well 3 and source/drain well offset regions 3s and 3d with a dopant concentration of $1.0\times10^{16}$ cm$^{-3}$ and a diffusion depth of about 5 μm, for example.

Figure 3C:
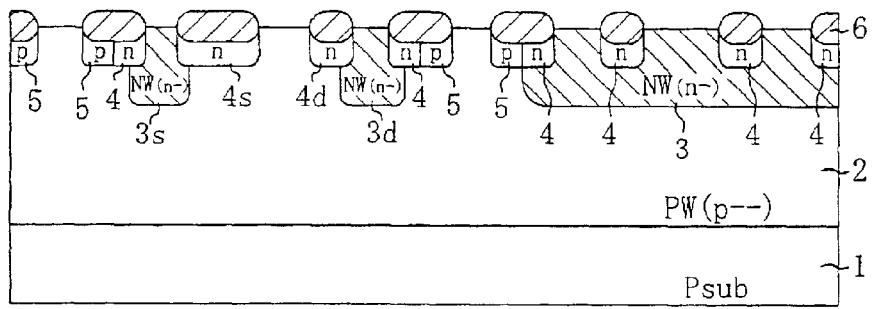

Subsequently, as shown in FIG. 3(c), the n-type isolating regions 4 and source/drain offset regions 4s and 4d are formed in the upper parts of the p-well 2 by photolithography and ion implantation processes. A resist pattern used for this process step should be designed to make the length Ls of the source offset region 4s greater than the length Ld of the drain offset region 4d. In the known structure, the lengths Ld and Ls of the source/drain offset regions are both set to 6.0 μm, for example. However, according to this embodiment, the n-type dopant ions such as phosphorus ions are implanted using a resist pattern that has been designed to have the length Ld of the drain offset region 4d unchanged at 6.0 μm but to increase the length Ls of the source offset region 4s to 9.0 μm. Thereafter, the p-type isolating regions 5 are formed by photolithography and ion implantation processes and the LOCOS regions 6 are formed to cover these regions. In the illustrated embodiment, ions of a p-type dopant such as boron ions are implanted using a resist pattern and then the substrate is annealed to form the LOCOS regions 6. As a result, the n- and p-type isolating regions 4 and 5 and source/drain offset regions 4s and 4d are formed to have a dopant concentration of $2.0 \times 10^{16}$ cm$^{-3}$ and a diffusion depth of about 2 μm, for example. By using the resist pattern that has been designed to make Ls longer than Ld, the source/drain offset regions 4s and 4d can be formed through the known process step with only their lengths changed (i.e., Ld<Ls) and without changing the concentration or diffusion depth thereof.

Figure 3D:
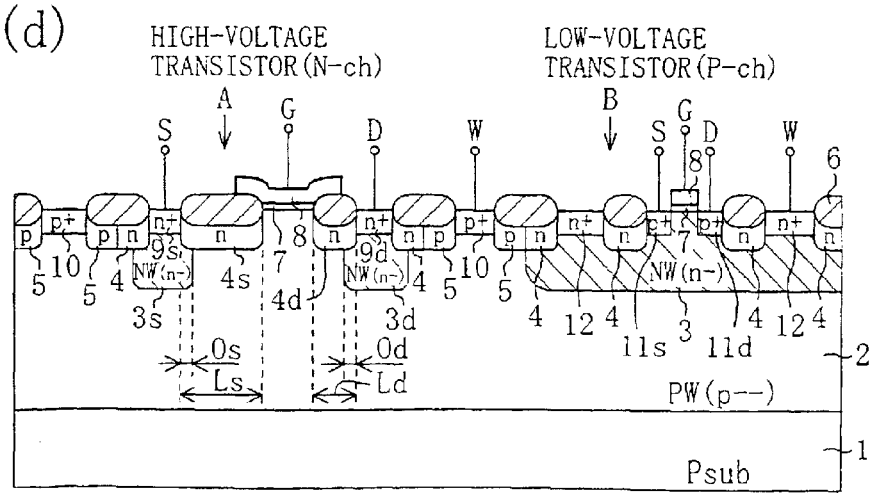

Thereafter, as shown in FIG. 3(d), the gate oxide film 7 and gate electrodes 8 are formed on the surface of the substrate 1. Finally, the source/drain regions 9s and 9d and 11s and 11d and channel stoppers 10 and 12 are formed by photolithography, ion implantation and annealing processes. In the illustrated embodiment, ions of an n-type dopant (e.g., phosphorus) are implanted using a resist pattern, and then the substrate is annealed to form the source/drain regions 9s and 9d for the high-voltage NMOS A. The source/drain regions 9s and 9d may have a dopant concentration of $2.0 \times 10^{20}$ cm$^{-3}$ and a diffusion depth of about 0.5 μm, for example.

In this manner, the high- and low-voltage MOS transistors A and B are formed on the same chip.

The known high-voltage MOS transistor has a sustaining breakdown voltage of 85 V, for example. On the other hand, the high-voltage MOS transistor according to this embodiment realizes a sustaining breakdown voltage of as high as 100 V, which is about 15 V higher than that of the known high-voltage MOS transistor.

Figure 10A:
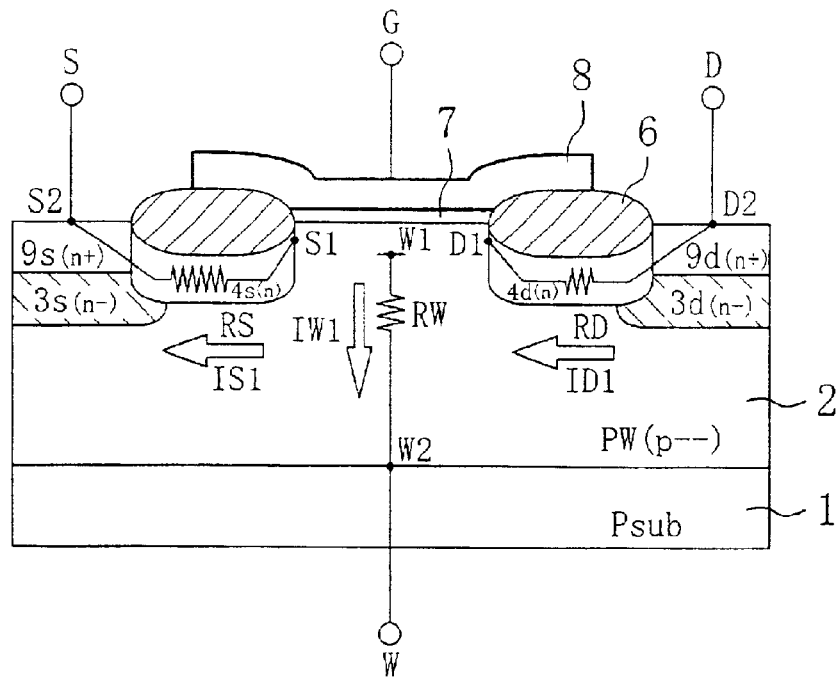
FIG. 10(a) is a cross-sectional view illustrating the structure of the inventive high-voltage MOS transistor in operation.

Hereinafter, it will be described with reference to FIGS. 10(a) and 10(b) how the high-voltage MOS transistor with the LOCOS offset structure of this embodiment operates. In the following description, the high-voltage MOS transistor is supposed to be an NMOS for illustrative purposes. FIG. 10(a) is a cross-sectional view illustrating the inventive high-voltage MOS transistor in operation, while FIG. 10(b) is a graph showing a relationship between the drain voltage and the current.

Like the known high-voltage MOS transistor, voltages are also applied to the inventive high-voltage MOS transistor at the electrode terminals a, D2, S2 and W2 in operation. However, it is the regions G, D1, S1 and W1 under the gate electrode 8 that actually operate as the gate, drain, source and well of the transistor. The electrode terminals D2, S2 and W2 are separated from the regions D1, S1 and W1 with resistance components RD, RS and RW for the drain and source offset regions 4d and 4s and the p-well 2 interposed therebetween. These resistance components RD, RS and RW are provided to prevent the intensity of an electric field from increasing too much.

When a positive voltage is applied to the gate electrode 8 and the drain region 9d, the high-voltage MOS transistor turns ON. As a result, not only the drain region 9d but also the drain offset and well offset regions 4d and 3d, which are lightly-doped layers of the same conductivity type, are depleted. When these regions 3d, 4d and 9d are sufficiently depleted by further increasing the voltage applied, electrons, which are the majority carriers in the n-type regions, start to move from the source toward the drain and a drain current ID1 starts to flow. Part of the drain current ID1 flows toward the source region 9s, which current is the "source current IS1". And the other part of the drain current ID1 flows vertically toward the well 2 and substrate 1, which current is the "substrate current IW1". That is to say, ID1=IS1+IW1. The relationship between the drain voltage VD1 and drain current ID1 is shown in FIG. 10(b).

Figure 10B:
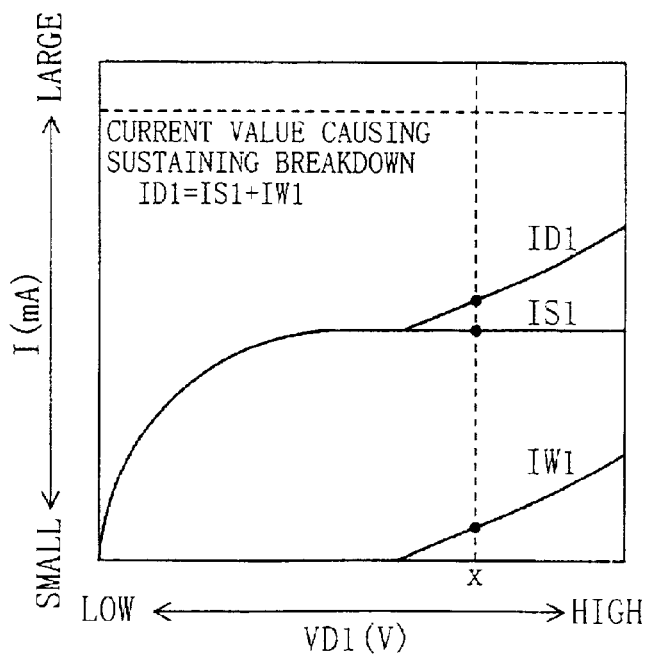
FIG. 10(b) is a graph illustrating a relationship between the drain voltage and the drain current of the inventive high-voltage MOS transistor in operation.
Figure 11:
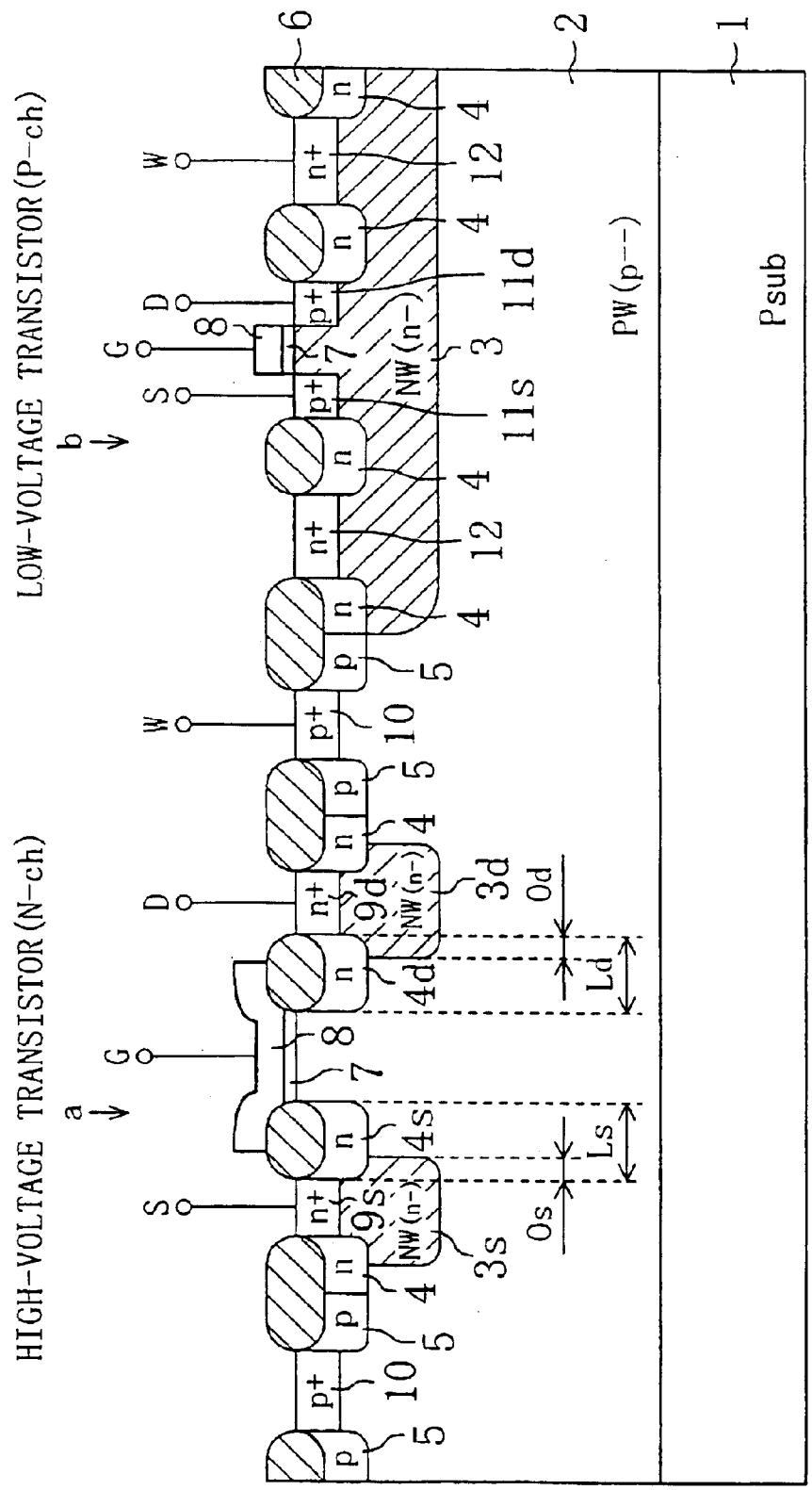
FIG. 11 is a cross-sectional view illustrating a known high-voltage MOS transistor.
Figure 12:
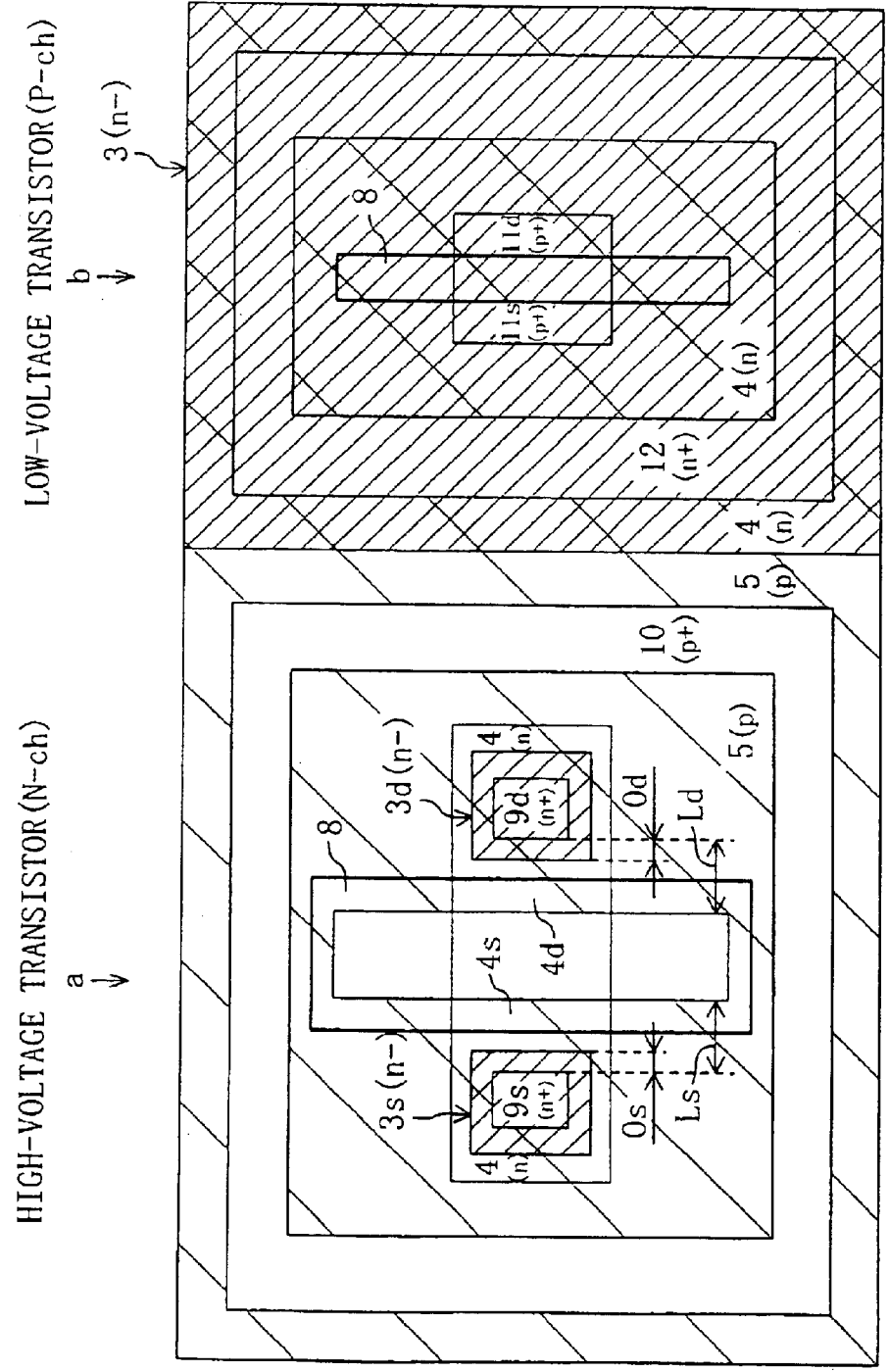
FIG. 12 is a plan view illustrating the known high-voltage MOS transistor.
Figure 13A:
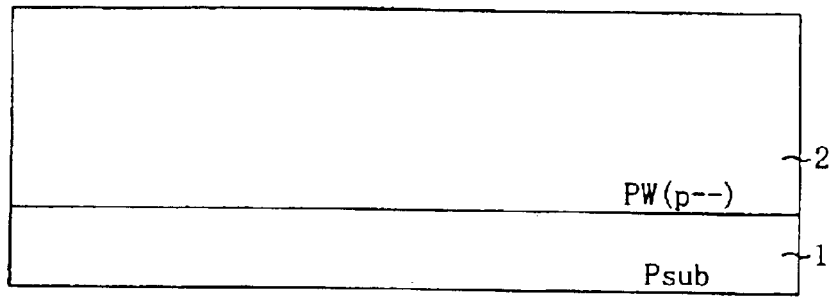
FIGS. 13(a) through 13(d) are cross-sectional views illustrating respective process steps, corresponding to those shown in FIGS. 3(a) through 3(d), for fabricating the known high-voltage MOS transistor.
Figure 13B:
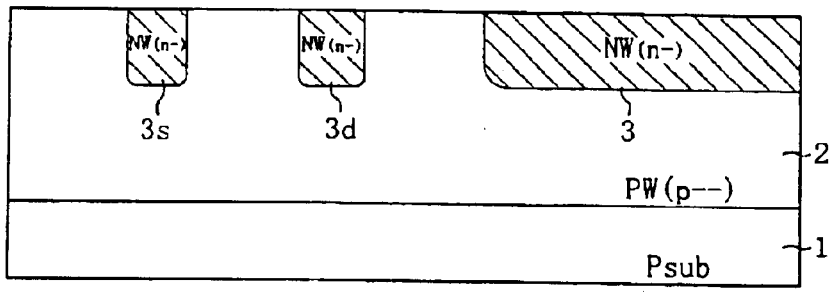
Figure 13C:
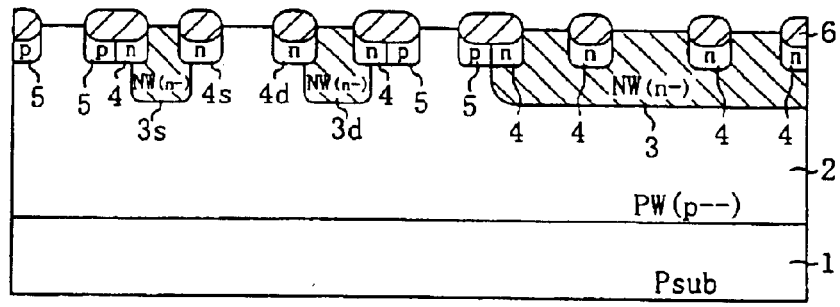
Figure 13D:
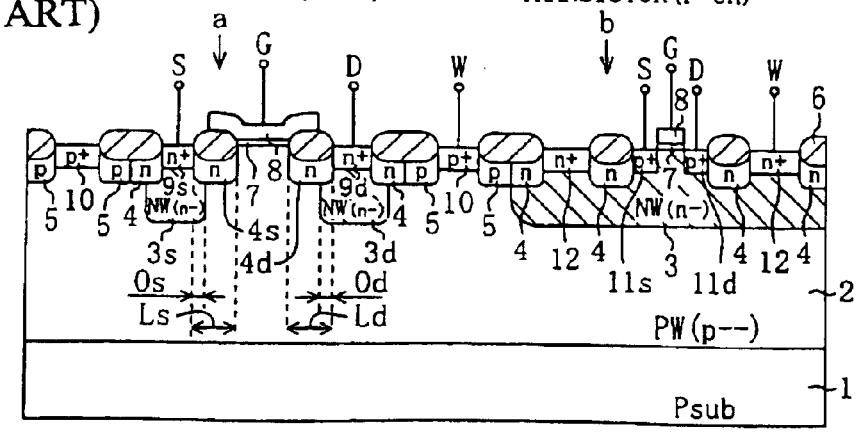
Figure 14A:
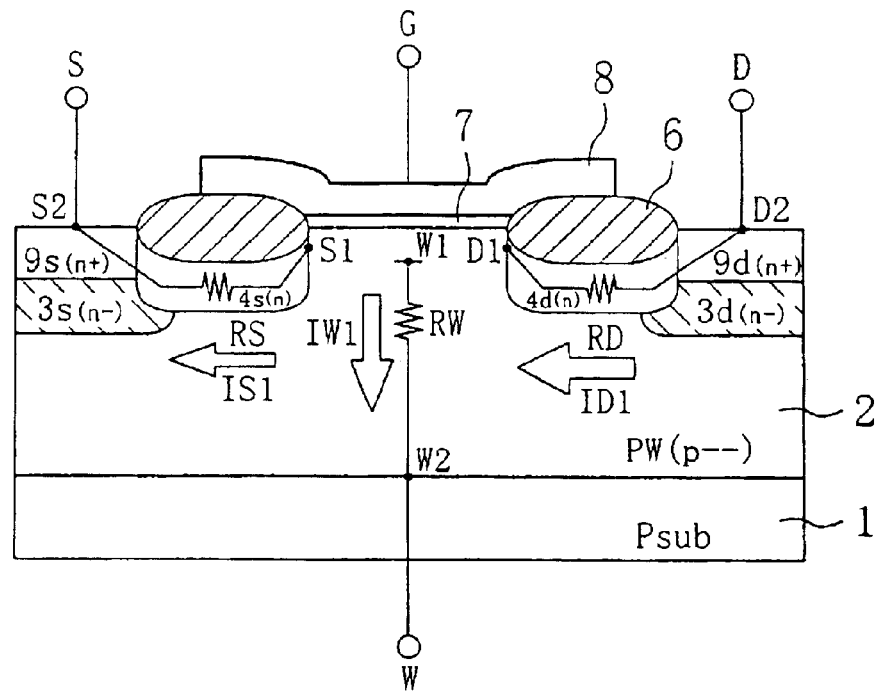
FIG. 14(a) is a cross-sectional view illustrating the structure of the known high-voltage MOS transistor in operation.
Figure 14B:
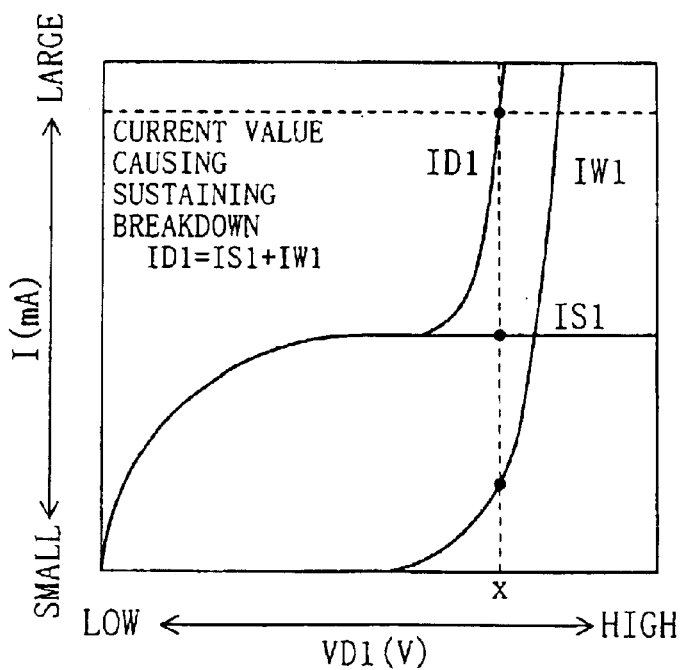
FIG. 14(b) is a graph illustrating a relationship between the drain voltage and the drain current of the known high-voltage MOS transistor in operation.

As can be seen from FIG. 10(b), when the drain voltage VD1 increases to reach a predetermined high voltage, the substrate current IW1 starts to flow, thereby generating a substrate potential VW1 (=RW·IW1) in the well 2. In the source region on the other hand, the amount of the source current IS1 flowing is the same as that of the known transistor. However, the resistance value RS of the source offset region 4s is higher than that of the known transistor, because the source offset region 4s is longer than that of the known transistor. Accordingly, at the same drain voltage VD1, the source potential VS1 of the inventive transistor is higher than that of the known transistor, because VS1= RS·IS1. That is to say, the higher the resistance RS of the source offset region 4s, the higher the source potential VS1. Thus, even at the voltage VD1 (=x(V)) at which the sustaining breakdown occurs in the known high-voltage MOS transistor, the source potential VS1 still can be equal to or higher than the substrate potential VW1 (=RW·IW1). In other words, the substrate potential VW1 minus the forward biased breakdown voltage of silicon can be kept equal to or less than the source potential VS1. Accordingly, the parasitic bipolar transistor, which is unintentionally formed by the regions D1, S1 and W1 in the known transistor, does not turn ON. The substrate current IW1 does not increase abruptly and therefore the drain current ID1 does not reach the value causing the sustaining breakdown in the transistor. As a result, the sustaining breakdown is avoidable.

As described above, according to the first embodiment, the size (i.e., the length) of the source offset region 4s is adjusted in such a manner as to set the resistance value RS of the source offset region 4s to an appropriate value. Thus, the transistor of this embodiment has an asymmetrical source/drain structure, in which the source offset region is greater in length that the drain offset region. However, it is still possible according to this embodiment to increase the sustaining breakdown voltage with good characteristics ensured for the MOS transistor and without changing the process steps.

In the foregoing embodiment, the present invention has been described as being applied to an NMOS. Naturally, though, the same effects are also attainable by applying the present invention to a PMOS.

EMBODIMENT 2

Next, a second embodiment of the present invention will be described with reference to the accompanying drawings.

Figure 4:
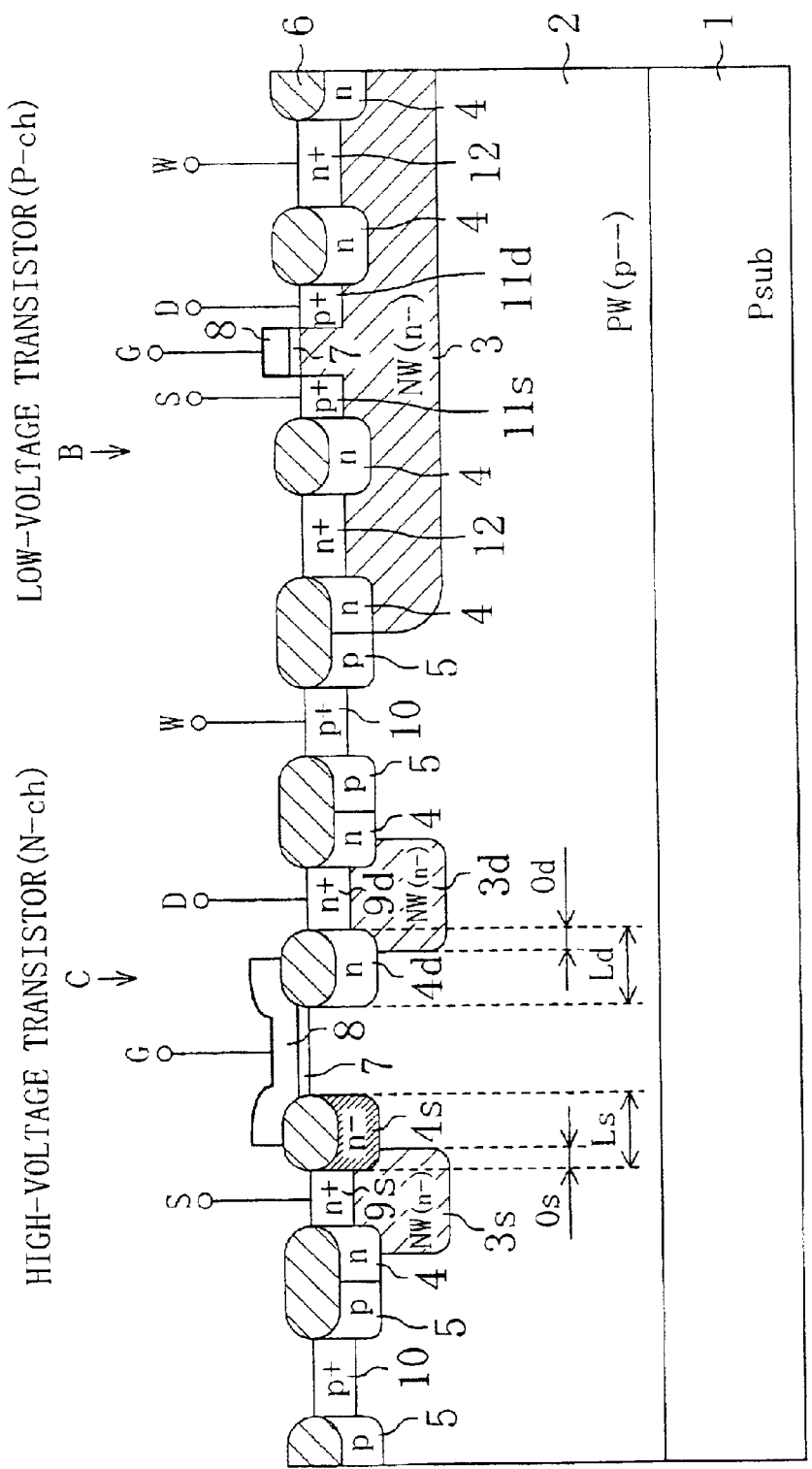
FIG. 4 is a cross-sectional view illustrating a high-voltage MOS transistor according to a second embodiment of the present invention.
Figure 5:
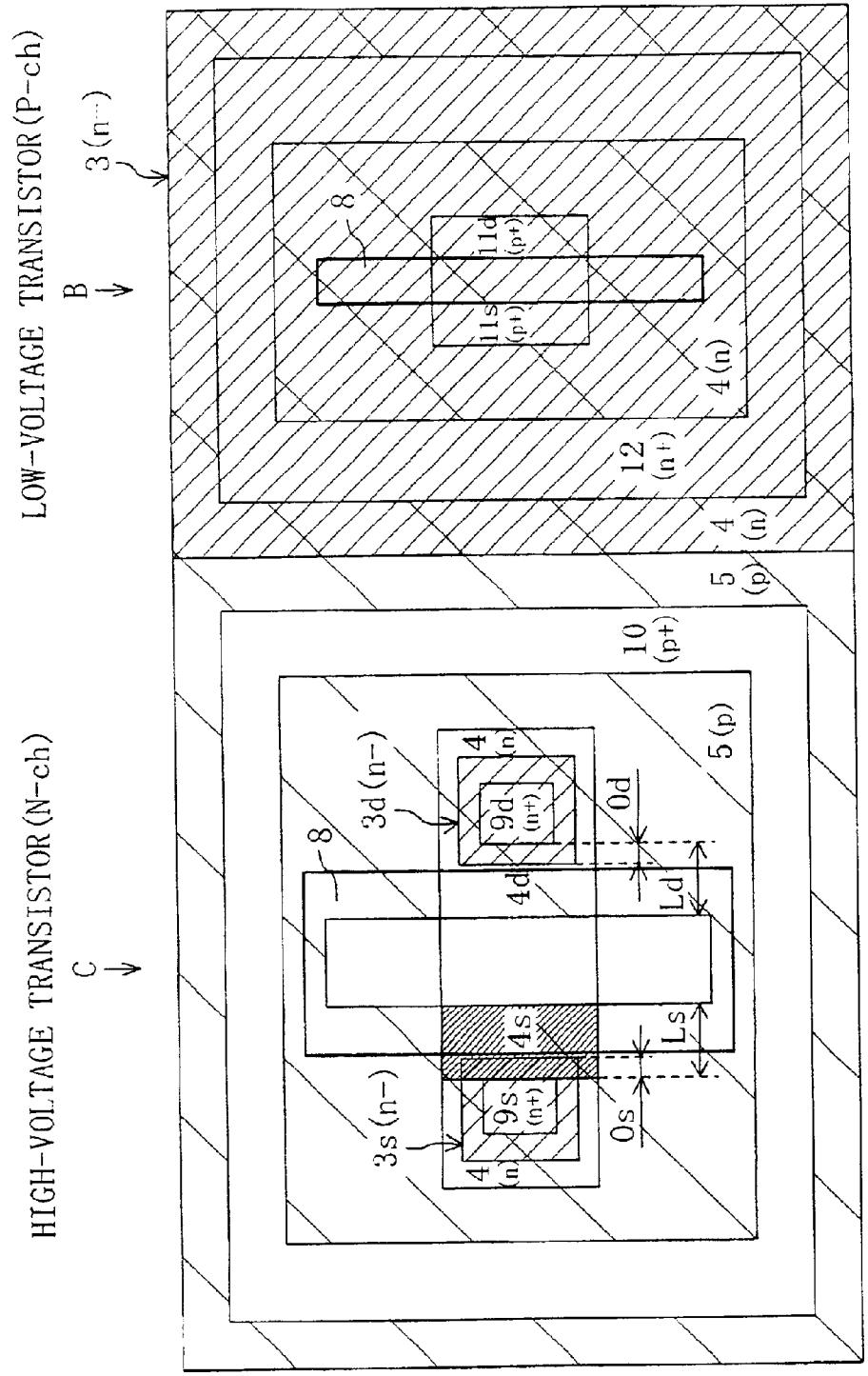
FIG. 5 is a plan view illustrating the high-voltage MOS transistor of the second embodiment.

Hereinafter, a high-voltage MOS transistor with a LOCOS offset structure according to the second embodiment will be described with reference to FIGS. 4 and 5. Specifically, FIGS. 4 and 5 are respectively a cross-sectional view and a plan view illustrating the high-voltage MOS transistor of the second embodiment. As shown in FIGS. 4 and 5, the high-voltage transistor is formed along with a low-voltage transistor on the same chip. In the illustrated embodiment, the high- and low-voltage transistors C and B are implemented as an NMOS and a PMOS, respectively.

First, the structure of the high-voltage transistor C will be described with reference to FIGS. 4 and 5. A p-well 2 is defined for the high-voltage NMOS c inside a p-type substrate 1 and a gate electrode 8 is formed over the p-well 2 with a gate oxide film 7 interposed therebetween. LOCOS regions 6 are formed around the edges of the gate electrode 8 and between the gate electrode 8 and source/drain regions 9s and 9d to electrically isolate the gate electrode 8 from the source/drain regions 9s and 9d on the surface of the substrate 1. Source/drain offset regions 4s and 4d are provided under the LOCOS regions 6 around the edges of the gate electrode 8. And source/drain well offset regions 3s and 3d are further provided under the source/drain regions 9s and 9d.

As shown in FIGS. 4 and 5, the source/drain offset regions 4s and 4d are defined such that Ls=Ld and the source/drain offset and well offset regions are defined such that Od=Os as in the known high-voltage MOS transistor. In the second embodiment, however, the dopant concentration of the source offset region 4s is set lower than that of the drain offset region 4d. In this structure, the gate, source and drain regions of the NMOS C are electrically isolated from a channel stopper 10, which is a doped layer for creating a potential in the p-well 2, by n- and p-type isolating regions 4 and 5 and the LOCOS regions 6.

Next, the structure of the low-voltage transistor B will be described with reference to FIGS. 4 and 5. An n-well 3 is defined for the low-voltage PMOS B inside the p-well 2. Another gate electrode 8 is formed over the n-well 3 with the gate oxide film 7 interposed therebetween, and source/drain regions 11s and 11d are defined on the left- and right-hand sides of the gate electrode 8. In this structure, the gate, source and drain regions of the PMOS B are electrically isolated from a channel stopper 12, which is a doped layer for creating a potential in the n-well 3, by the n- and p-type isolating regions 4 and 5 and LOCOS regions 6.

Hereinafter, a method for fabricating the high-voltage MOS transistor with the LOCOS offset structure of the second embodiment will be described with reference to FIGS. 6(a) through 6(d).

Figure 6A:
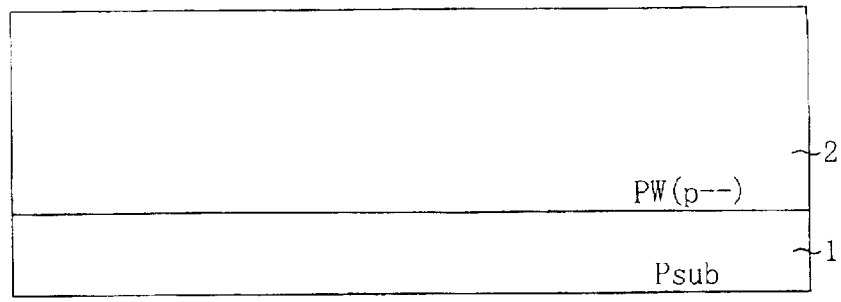
FIGS. 6(a) through 6(d) are cross-sectional views illustrating respective process steps, corresponding to those shown in FIGS. 3(a) through 3(d), for fabricating the high-voltage MOS transistor of the second embodiment.

First, as shown in FIG. 6(a), the p-well 2 is defined in the surface region of the p-type substrate 1 by photolithography, ion implantation and annealing processes. In the illustrated embodiment, ions of a p-type dopant (e.g., boron) are implanted into the surface region of the p-type substrate 1 with a resistivity of 10 to 50 Ω·cm using a resist pattern that has been defined to form the well 2 for the high-voltage transistor. Then, the substrate is annealed to form the p-well 2 with a dopant concentration of $2.0 \times 10^{15}$ $cm^{-3}$ and a diffusion depth of about 15 μm, for example.

Figure 6B:
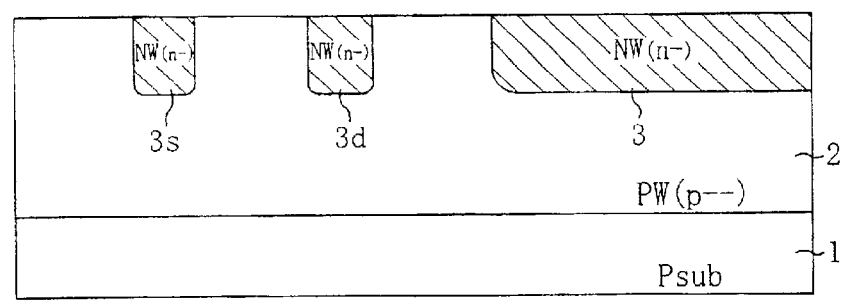

Next, as shown in FIG. 6(b), the n-well 3 and source/drain well offset regions 3s and 3d are defined in respective surface regions of the p-well 2 by photolithography, ion implantation and annealing processes. In the illustrated embodiment, ions of an n-type dopant (e.g., phosphorus) are implanted using a resist pattern that has been defined to form the well 3 for the low-voltage transistor. Then, the substrate is annealed to form the n-well 3 and source/drain well offset regions 3s and 3d with a dopant concentration of $1.0 \times 10^{16}$ $cm^{-3}$ and a diffusion depth of about 5 μm, for example.

Figure 6C:
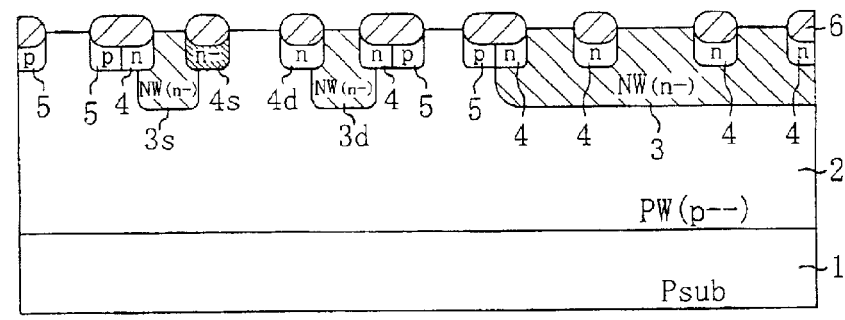

Subsequently, as shown in FIG. 6(c), the n-type isolating regions 4 and drain offset region 4d are formed in the upper parts of the p-well 2 by an ion implantation process. The source offset region 4s is formed by implanting ions using a different resist pattern, such as that shown in FIG. 5, which will make the dopant concentration of the source offset region 4s lower than that of the drain offset region 4d. Thereafter, the p-type isolating regions 5 are formed by photolithography and ion implantation processes and the LOCOS regions 6 are formed to cover these regions.

In the illustrated embodiment, ions of an n-type dopant such as phosphorus and ions of a p-type dopant such as boron. are implanted using different resist patterns and then the substrate is annealed to form the LOCOS regions 6. As a result, the n- and p-type isolating regions 4 and 5 and drain offset region 4d are formed to have a dopant concentration of $2.0 \times 10^{16}$ $cm^{-3}$ and a diffusion depth of about 2 μm, while the source offset region 4s is formed to have a dopant concentration of $1.3 \times 10^{16}$ $cm^{-3}$ and a diffusion depth of about 1.6 μm, for example.

Figure 6D:
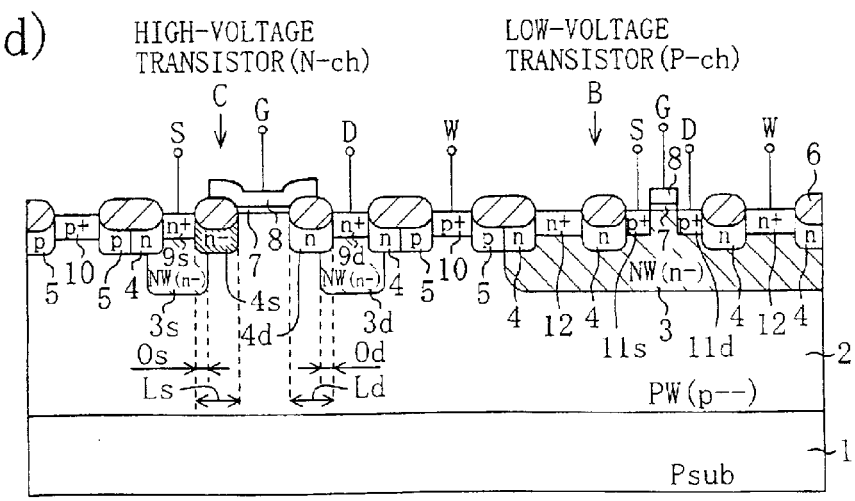

Thereafter, as shown in FIG. 6(d), the gate oxide film 7 and gate electrodes 8 are formed on the surface of the substrate 1. Finally, the source/drain regions 9s and 9d and 11s and 11d and the channel stoppers 10 and 12 are formed by photolithography, ion implantation and annealing processes. In the illustrated embodiment, ions of an n-type dopant (e.g., phosphorus) are implanted using a resist pattern, and then the substrate is annealed to form the source/drain regions 9s and 9d for the high-voltage NMOS C. The source/drain regions 9s and 9d may have a dopant concentration of $2.0 \times 10^{20}$ $cm^{-3}$ and a diffusion depth of about 0.5 μm, for example.

In this manner, the high- and low-voltage MOS transistors C and B are formed on the same chip.

The known high-voltage MOS transistor has a sustaining breakdown voltage of 85 V, for example. On the other hand, the high-voltage MOS transistor according to this embodiment realizes a sustaining breakdown voltage of as high as 100 V, which is about 15 V higher than that of the known high-voltage MOS transistor.

Hereinafter, it will be described with reference to FIGS. 10(a) and 10(b) how the high-voltage MOS transistor with the LOCOS offset structure of this embodiment operates. In the following description, the high-voltage MOS transistor is supposed to be an NMOS for illustrative purposes. FIG. 10(a) is a cross-sectional view illustrating the inventive high-voltage MOS transistor in operation, while FIG. 10(b) is a graph showing a relationship between the drain voltage and the current.

Like the known high-voltage MOS transistor, voltages are also applied to the inventive high-voltage MOS transistor at the electrode terminals G, D2, S2 and W2 in operation. However, it is the regions G, D1, S1 and W1 under the gate electrode 8 that actually operate as the gate, drain, source and well of the transistor. The electrode terminals D2, S2 and W2 are separated from the regions D1, S1 and W1 with resistance components RD, RS and RW for the drain and source offset regions 4d and 4s and the p-well 2 interposed therebetween. These resistance components are provided to prevent the intensity of an electric field from increasing too much.

When a positive voltage is applied to the gate electrode 8 and the drain region 9d, the high-voltage MOS transistor turns ON. As a result, not only the drain region 9d but also the drain offset and well offset regions 4d and 3d, which are lightly-doped layers of the same conductivity type, are depleted. When these regions 3d, 4d and 9d are sufficiently depleted by further increasing the voltage applied, electrons, which are the majority carriers in the n-type regions, start to move from the source toward the drain and a drain current ID1 starts to flow. Part of the drain current TD1 flows toward the source region 9s, which current is the source current IS1. And the other part of the drain current ID1 flows vertically toward the well 2 and the substrate 1, which current is the substrate current IW1. That is to say, ID1=IS1+IW1. The relationship between the drain voltage VD1 and the current is shown in FIG. 10(b).

As can be seen from FIG. 10(b), when the drain voltage VD1 increases to reach a predetermined high voltage, the substrate current IW1 starts to flow, thereby generating a potential VW1 (=RW·IW1) in the well 2. In the source region on the other hand, the amount of the source current IS1 flowing is the same as that of the known transistor. However, the resistance value RS of the source offset region 4s is higher than that of the known transistor. This is because the dopant concentration of the source offset region 4s is made lower than that of the known transistor by decreasing the implant dose for the source offset region 4s. Accordingly, at the same drain voltage VD1, the source potential VS1 of the inventive transistor is higher than that of the known transistor, because VS1=RS·IS1. That is to say, the higher the resistance value RS of the source offset region 4s, the higher the source potential VS1. Thus, even at the voltage VD1 (=x(V)) at which the sustaining breakdown occurs in the known high-voltage MOS transistor, the source potential VS1 still can be equal to or higher than the substrate potential VW1 (=RW·IW1). In other words, the substrate potential VW1 minus the forward biased breakdown voltage of silicon can be kept equal to or less than the source potential VS1. Accordingly, the parasitic bipolar transistor, which is unintentionally formed by the regions D1, S1 and W1 in the known MOS transistor, does not turn ON. The substrate current IW1 does not increase abruptly and therefore the drain current ID1 does not reach the value causing the sustaining breakdown in the transistor. As a result, the sustaining breakdown is avoidable.

As described above, according to the second embodiment, the implant dose for the source offset region 4s is controlled in such a manner as to set the resistance value RS of the source offset region 4s to an appropriate value. Thus, the transistor of this embodiment has an asymmetrical dopant concentration profile, in which the source offset region has a dopant concentration lower than that of the drain offset region. In addition, the number of process steps needed must be increased by one as a result. However, it is still possible according to this embodiment to increase the sustaining breakdown voltage with good characteristics ensured for the MOS transistor and without changing the sizes of the offset regions.

The dopant concentration of the source offset region 4s is preferably lower than that of the source region 9s but higher than that of the source well offset region 3s.

In the foregoing embodiment, dopant ions are implanted lightly into the source offset region 4s that has been selected using a resist pattern. Alternatively, dopant ions of the opposite conductivity type may be implanted into the source offset region 4s to decrease the n-type dopant concentration in that region 4s after the source/drain offset regions 4s and 4d have been formed as in the known process.

In the foregoing embodiment, the present invention has been described as being applied to an NMOS. Naturally, though, the same effects are also attainable by applying the present invention to a PMOS.

EMBODIMENT 3

Next, a third embodiment of the present invention will be described with reference to the accompanying drawings.

Figure 7:
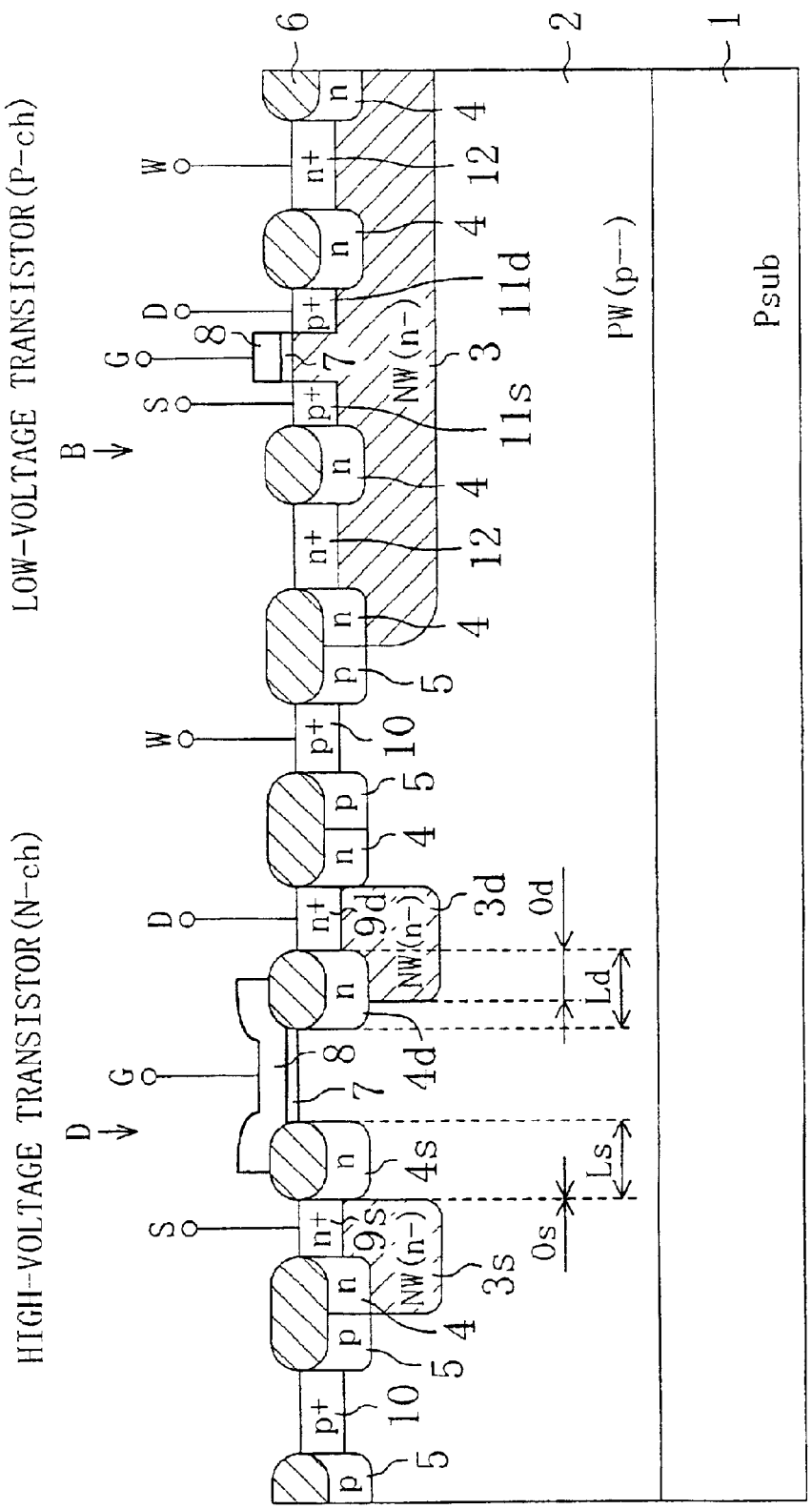
FIG. 7 is a cross-sectional view illustrating a high-voltage MOS transistor according to a third embodiment of the resent invention.
Figure 8:
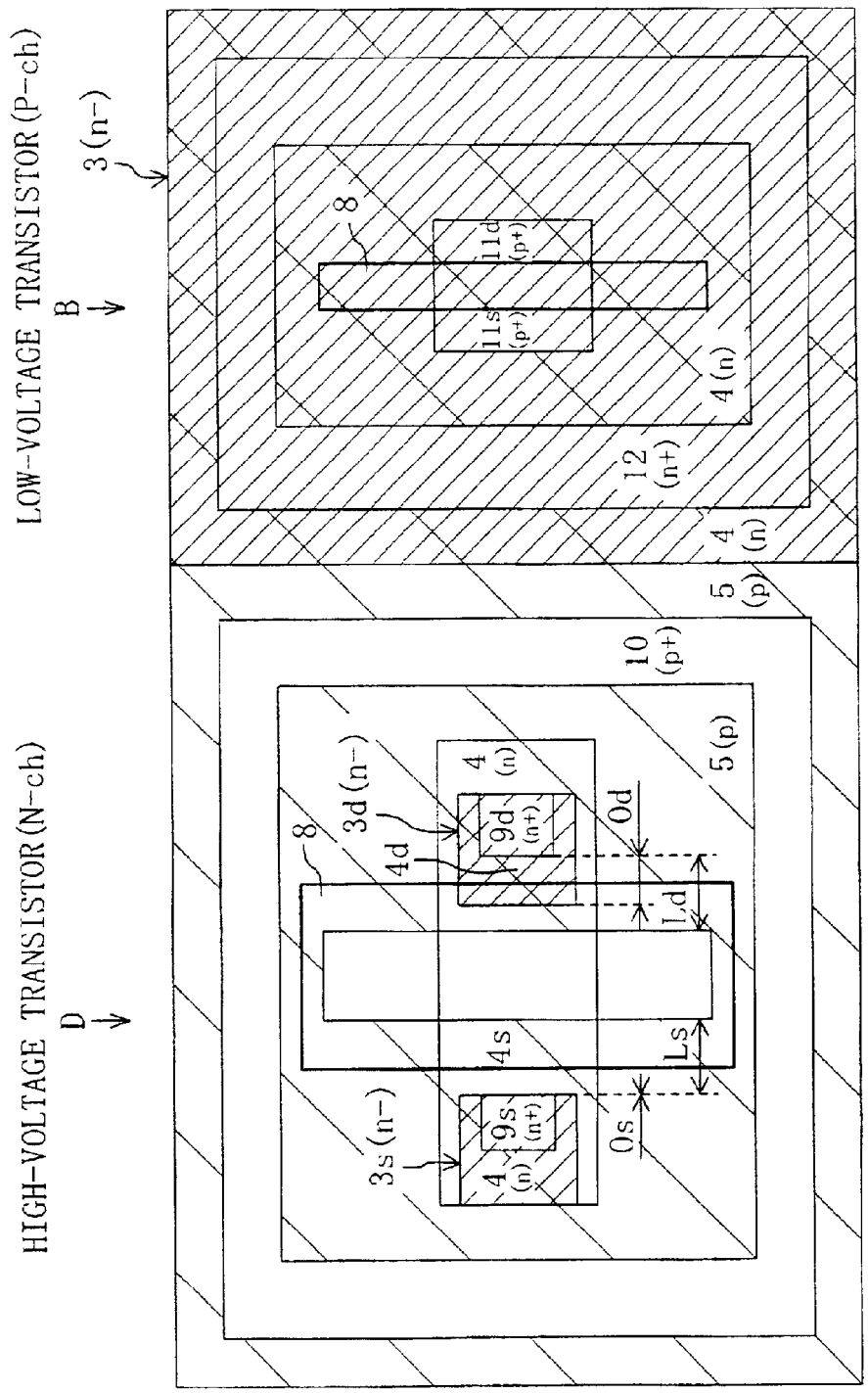
FIG. 8 is a plan view illustrating the high-voltage MOS transistor of the third embodiment.

Hereinafter, a high-voltage MOS transistor with a LOCOS offset structure of the third embodiment will be described with reference to FIGS. 7 and 8. FIGS. 7 and 8 are respectively a cross-sectional view and a plan view illustrating the high-voltage MOS transistor of the third embodiment. As shown in FIGS. 7 and 8, the high-voltage transistor is formed along with a low-voltage transistor on the same chip.

In the illustrated embodiment, the high- and low-voltage transistors D and B are implemented as an NMOS and a PMOS, respectively.

First, the structure of the high-voltage transistor D will be described with reference to FIGS. 7 and 8. A p-well 2 is defined for the high-voltage NMOS D inside a p-type substrate 1 and a gate electrode 8 is formed over the p-well 2 with a gate oxide film 7 interposed therebetween. LOCOS regions 6 are formed around the edges of the gate electrode 8 and between the gate electrode 8 and source/drain regions 9s and 9d to electrically isolate the gate electrode 8 from the source/drain regions 9s and 9d on the surface of the substrate 1. Source/drain offset regions 4s and 4d are provided under the LOCOS regions 6 around the edges of the gate electrode 8. And source/drain well offset regions 3s and 3d are further provided under the source/drain regions 9s and 9d.

As shown in FIGS. 7 and 8, the source/drain offset regions 4s and 4d are defined such that Ls=Ld as in the known high-voltage MOS transistor but the source/drain offset and well offset regions are defined such that Od>Os. Specifically, the length Od of a region overlapping between the drain offset and well offset regions 4d and 3d is greater than that of the known transistor. And the dopant concentration of this overlapping region is the sum of those of the drain offset and well offset regions 4d and 3d. In contrast, the length Os of a region overlapping between the source offset and well offset regions 4s and 3s is relatively small (i.e., approximately zero in the embodiment shown in FIG. 7). And the dopant concentration of this overlapping region is decreased by that of the p-well 2 of the conductivity type opposite to that of the source offset region 4s. That is to say, the transistor of this embodiment has an asymmetrical dopant concentration profile, in which the dopant concentrations of the drain and source offset regions 4d and 4s are respectively higher and lower than that of the known transistor.

In this structure, the gate, source and drain regions of the NMOS D are electrically isolated from a channel stopper 10, which is a doped layer for creating a potential in the p-well 2, by n- and p-type isolating regions 4 and 5 and LOCOS regions 6.

Next, the structure of the low-voltage transistor B will be described with reference to FIGS. 7 and 8. An n-well 3 is defined for the low-voltage PMOS B inside the p-well 2. Another gate electrode 8 is formed over the n-well 3 with the gate oxide film 7 interposed therebetween, and source/drain regions 11s and 11d are defined on the left- and right-hand sides of the gate electrode 8. In this structure, the gate, source and drain regions of the PMOS B are electrically isolated from a channel stopper 12, which is a doped layer for creating a potential in the n-well 3, by the n- and p-type isolating regions 4 and 5 and LOCOS regions 6.

Hereinafter, a method for fabricating the high-voltage MOS transistor with the LOCOS offset structure of the third embodiment will be described with reference to FIGS. 9(a) through 9(d).

Figure 9A:
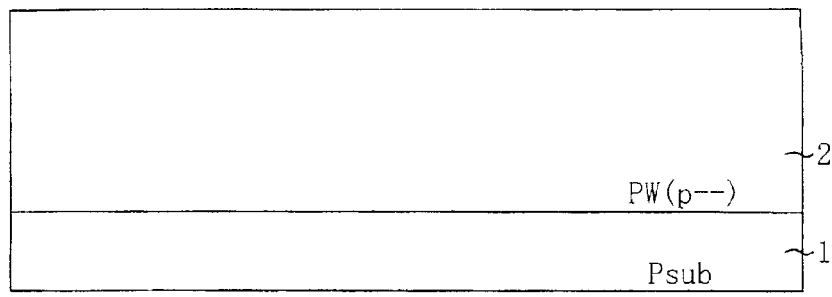
FIGS. 9(a) through 9(d) are cross-sectional views illustrating respective process steps, corresponding to those shown in FIGS. 3(a) through 3(d), for fabricating the high-voltage MOS transistor of the third embodiment.

First, as shown in FIG. 9(a), the p-well 2 is defined in the surface region of the p-type substrate 1 by photolithography, ion implantation and annealing processes. In the illustrated embodiment, ions of a p-type dopant (e.g., boron) are implanted into the surface region of the p-type substrate 1 with a resistivity of 10 to 50 Ω·cm using a resist pattern that has been defined to form the well 2 for the high-voltage transistor. Then, the substrate is annealed to form the p-well 2 with a dopant concentration of $2.0 \times 10^{15}$ cm$^{-3}$ and a diffusion depth of about 15 μm, for example.

Figure 9B:
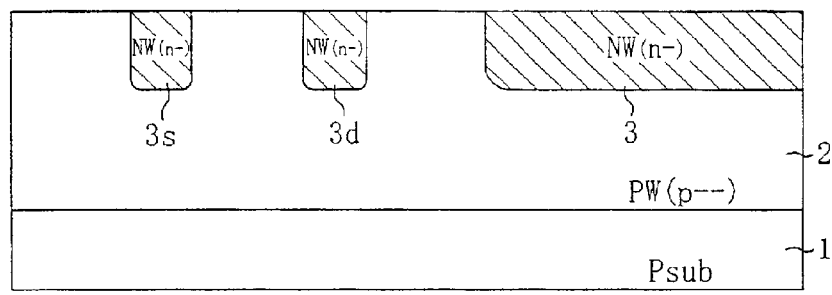

Next, as shown in FIG. 9(b), the n-well 3 for the low-voltage transistor B and the source/drain well offset regions 3s and 3d for the high-voltage transistor D are formed at a time in respective surface regions of the p-well 2 by photolithography, ion implantation and annealing processes. In this process step, the resist pattern used for forming the n-well 3 for the low-voltage transistor B is shifted leftward from its normal position (i.e., from the gate electrode toward the source region) in FIG. 7. In the illustrated embodiment, the resist pattern is shifted from its normal position toward the source by about 6.0 μm. Using this resist pattern, ions of an n-type dopant (e.g., phosphorus) are implanted. Then, the substrate is annealed to form the n-well 3 and source/drain well offset regions 3s and 3d with a dopant concentration of $1.0 \times 10^{16}$ cm$^{-3}$ and a diffusion depth of 5 μm, for example.

Figure 9C:
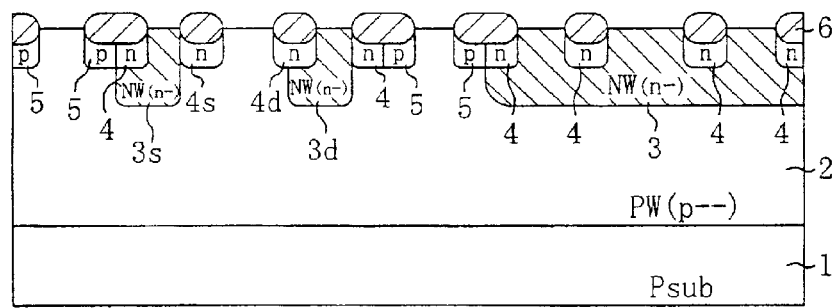

Subsequently, as shown in FIG. 9(c), the n-type isolating regions 4 and source/drain offset regions 4s and 4d are formed in the upper parts of the p-well 2 by photolithography and ion implantation processes. In the third embodiment, the source/drain well offset regions 3s and 3d have been shifted from their normal positions toward the source in the previous process step. Thus, if the resist patterns are defined in their normal positions in the subsequent process steps, then the source/drain offset and well offset regions will be automatically defined such that Od>Os. However, the lengths of the offset regions themselves are still equal to each other (i.e., Ld=Ls) because the same resist pattern as that applied to the known transistor is also used in this embodiment. In this manner, an asymmetrical dopant concentration profile, in which the concentrations of the drain and source regions are respectively higher and lower than that of the known transistor, is obtained using the existent resist patterns and without changing the specific lengths of the offset and well offset regions. Thereafter, the p-type isolating regions 5 are formed by photolithography and ion implantation processes and then the LOCOS regions 6 are formed to cover these regions.

In the illustrated embodiment, ions of an n-type dopant such as phosphorus and ions of a p-type dopant such as boron are implanted using a resist pattern and then the substrate is annealed to form the LOCOS regions 6. As a result, the n- and p-type isolating regions 4 and 5 are formed to have a dopant concentration of $2.0 \times 10^{16}$ cm$^{-3}$ and a diffusion depth of about 2 μm. The drain offset region 4d is formed to have a dopant concentration of $3.0 \times 10^{16}$ cm$^{-3}$ and a diffusion depth of about 2 μm, for example. And the source offset region 4s is formed to have a dopant concentration of $1.3 \times 10^{16}$ cm$^{-3}$ and a diffusion depth of about 1.3 μm, for example.

In this embodiment, the lengths Ls and Ld of the source/drain offset regions 4s and 4d are both 6.0 μm, because the normal resist pattern is also used herein. And with the source/drain offset regions 4s and 4d fixed, the source/drain well offset regions 3s and 3d for the high-voltage transistor and the n-well 3 for the low-voltage transistor are shifted toward the source by about 6.0 μm such that Od>Os.

Figure 9D:
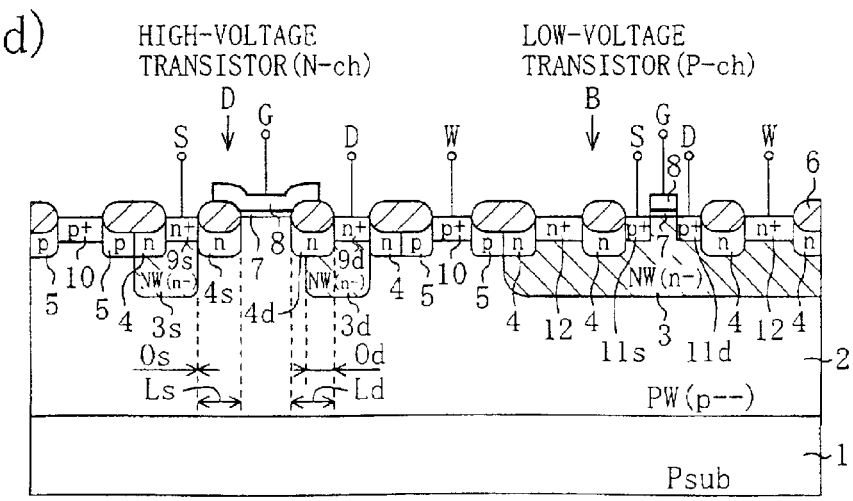

Thereafter, as shown in FIG. 9(d), the gate oxide film 7 and gate electrodes 8 are formed on the surface of the substrate 1. Finally, the source/drain regions 9s and 9d and 11s and 11d and channel stoppers 10 and 12 are formed by photolithography, ion implantation and annealing processes. In the illustrated embodiment, ions of an n-type dopant (e.g., phosphorus) are implanted using a resist pattern, and then the substrate is annealed to form the source/drain regions 9s and 9d for the high-voltage NMOS D. The source/drain regions 9s and 9d may have a dopant concentration of $2.0 \times 10^{20}$ cm$^{-3}$ and a diffusion depth of about 0.5 μm, for example.

In this manner, the high- and low-voltage MOS transistors D and B are formed on the same chip.

The known high-voltage MOS transistor has a sustaining breakdown voltage of 85 V, for example. On the other hand, the high-voltage MOS transistor according to this embodiment realizes a sustaining breakdown voltage of as high as 100 V, which is about 15 V higher than that of the known high-voltage MOS transistor.

Hereinafter, it will be described with reference to FIGS. 10(a) and 10(b) how the high-voltage MOS transistor with the LOCOS offset structure of this embodiment operates. In the following description, the high-voltage MOS transistor is supposed to be an NMOS for illustrative purposes. FIG. 10(a) is a cross-sectional view illustrating the inventive high-voltage MOS transistor in operation, while FIG. 10(b) is a graph showing a relationship between the drain voltage and the current.

Like the known high-voltage MOS transistor, voltages are also applied to the inventive high-voltage MOS transistor at the electrode terminals G, D2, S2 and W2 in operation. However, it is the regions G, D1, S1 and W1 under the gate electrode 8 that actually operate as the gate, drain, source and well of the transistor. The electrode terminals D2, S2 and W2 are separated from the regions D1, S1 and W1 with resistance components RD, RS and RW for the drain and source offset regions 4d and 4s and the p-well 2 interposed therebetween. These resistance components are provided to prevent the intensity of an electric field from increasing too much.

When a positive voltage is applied to the gate electrode 8 and the drain region 9d, the high-voltage MOS transistor turns ON. As a result, not only the drain region 9d but also the drain offset and well offset regions 4d and 3d, which are lightly-doped layers of the same conductivity type, are depleted. When these regions 3d, 4d and 9d are sufficiently depleted by further increasing the voltage applied, electrons, which are the majority carriers in the n-type regions, start to move from the source toward the drain and a drain current ID1 starts to flow. Part of the drain current ID1 flows toward the source region 9s, which current is the source current IS1. And the other part of the drain current ID1 flows vertically toward the well 2 and the substrate 1, which current is the substrate current IW1. That is to say, ID1=IS1+IW1. The relationship between the drain voltage VD1 and the current is shown in FIG. 10(b).

As can be seen from FIG. 10(b), when the drain voltage VD1 increases to reach a predetermined high voltage, the substrate current IW1 starts to flow, thereby generating a potential VW1=RW·IW1) in the well 2. In the source region on the other hand, the amount of the source current IS1 flowing is the same as that of the known transistor. However, the resistance value RS of the source offset region 4s is higher than that of the known transistor. This is because the resist pattern for forming the well 3 for the low-voltage transistor has been shifted from its normal position toward the source and the dopant concentration of the source offset region 4s is lower than that of the known transistor. Accordingly, at the same drain voltage VD1, the source potential VS1 of the inventive transistor is higher than that of the known transistor, because VS1=RS·IS1. That is to say, the higher the resistance value RS of the source offset region 4s, the higher the source potential VS1. Thus, even at the voltage VD1 (=x(V)) at which the sustaining breakdown occurs in the known high-voltage MOS transistor, the source potential VS1 still can be equal to or higher than the substrate potential VW1 (=RW·IW1). In other words, the substrate potential VW1 minus the forward biased breakdown voltage of silicon can be kept equal to or less than the source potential VS1. Accordingly, the parasitic bipolar transistor, which is unintentionally formed by the regions D1, S1 and W1 in the known MOS transistor, does not turn ON. The substrate current DW1 does not increase abruptly and therefore the drain current ID1 does not reach the value causing the sustaining breakdown in the transistor. As a result, the sustaining breakdown is avoidable.

As described above, according to the third embodiment, the dopant concentration of the source offset region 4s is controlled in such a manner as to set the resistance value RS of the source offset region 4s to an appropriate value. Thus, the transistor of this embodiment has an asymmetrical dopant concentration profile, in which the dopant concentration is lower in the source offset region than in the drain offset region. However, it is still possible according to this embodiment to increase the sustaining breakdown voltage with the normal resist pattern used, with good characteristics ensured for the MOS transistor and without changing the sizes of the offset regions or the process steps.

The resist pattern for forming the well for the low-voltage transistor may be shifted such that the source well offset region 3s moves away from the gate electrode 8 but is still in contact with the source offset region 4s and out of contact with the p-type isolating region 5.

In the foregoing embodiment, the normal resist pattern is used and shifted toward the source to set the resistance value RS of the source offset region 4s to an appropriate value. However, if a resist pattern is newly defined, then the drain and source currents Id and Is and the lengths Od and Os of the overlapping regions should be designed as shown in FIGS. 7 and 8.

In the foregoing embodiment, the present invention has been described as being applied to an NMOS. Naturally, though, the same effects are also attainable by applying the present invention to a PMOS.

A resist pattern for forming the well 3 for the low-voltage transistor B may be applicable to forming the source/drain well offset regions 3s and 3d for the high-voltage transistor D in the fabrication process of the high-voltage transistor D. In that case, the same effects as those of the first and second embodiments are also attainable according to the third embodiment just by slightly shifting that resist pattern. And yet the sizes of the well offset regions 3s and 3d need not be changed and no additional process steps are required. Thus, the method of the third embodiment is particularly advantageous considering its simplicity and cost effectiveness.

What is claimed is:

1. A high-voltage MOS transistor wherein a dopant concentration of a drain offset region is set independently of a dopant concentration of a source offset region in the entire drain offset region, and the dopant concentration of the source offset region is set lower than the dopant concentration of the drain offset region and thereby a resistance value of the source offset region is set independently of a resistance value of the offset region in such a manner as to maintain a high sustaining breackdown voltage of the high-voltage MOS transistor, which is based on a voltage of the source offset region and a voltage of a substrate region directly under a gate insulating film during operation of the high-voltage MOS transistor.

2. A high-voltage MOS transistor wherein a dopant concentration of a source offset region is set lower that a dopant concentration of a drain offset region such that the following inequality is not satisfied during operation of the high-voltage MOS transistor:

VW−(a forward biased breakdown voltage of silicon)>VS where, VW is a substrate voltage of a substrate region directly under a gate insulating film, and VS is a source voltage of the source offset region, and thereby a resistance value of the source offset region is set independently of a resistance value of the drain offset region in such a manner as to maintain a high sustaining breakdown voltage or the high-voltage MOS transistor, which is based on a voltage of the source offset region and a voltage of the substrate region directly under a gate insulating film during operation of the high-voltage MOS transistor.

3. A high-voltage MOS transistor wherein a length of a region overlapping between a source offset region and a source well offset region is set smaller than a length of a region overlapping between a drain offset region and a drain well offset region and thereby a resistance value of source offset region is set independently of a resistance value of the drain offset region in such a manner as to maintain a high-sustaining breakdown voltage of the high-voltage MOS transistor, which is based on a voltage of the source offset region and a voltage of a substrate region directly under a gate insulating film during operation of the high-voltage MOS transistor.

4. A high-voltage MOS transistor wherein a length of a region overlapping between a source offset region and a source well offset region is set smaller than a length of a region overlapping between a drain offset region and a drain well offset region such that the following inequality is not satisfied during operation of the high-voltage MOS transistor:

VW−(a forward biased breakdown voltage of silicone )>VS where VW is a substrate voltage of a substrate region directly under a gate insulating film and VS is a source voltage of the source offset region, and thereby a resistance value of the source offset region is set independently of a resistance value of the drain offset in such a manner as to maintain a high sustaining breakdown voltage of the high-voltage MOS transistor, which is based on a voltage of the source offset region and a voltage of the substrate region directly under a gate insulating film during operation of the high-voltage MOS transistor.

* * * * *

UNITED STATES PATENT AND TRADEMARK OFFICE
CERTIFICATE OF CORRECTION

PATENT NO. : 6,784,490 B1
DATED : August 31, 2004
INVENTOR(S) : Haruko Inoue et al.

It is certified that error appears in the above-identified patent and that said Letters Patent is hereby corrected as shown below:

Column 18,
Line 19, please change the word "or" to -- of --.

Signed and Sealed this

Twenty-sixth Day of April, 2005

JON W. DUDAS
*Director of the United States Patent and Trademark Office*